US012080479B2

(12) United States Patent
Park

(10) Patent No.: US 12,080,479 B2
(45) Date of Patent: Sep. 3, 2024

(54) CHIP CAPACITOR INCLUDING CAPACITOR WIRES

(71) Applicant: Samsung Electronics Co., Ltd., Suwon-si (KR)

(72) Inventor: Soojae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 17/990,120

(22) Filed: Nov. 18, 2022

(65) Prior Publication Data
US 2023/0307180 A1 Sep. 28, 2023

(30) Foreign Application Priority Data
Mar. 28, 2022 (KR) .................. 10-2022-0038397

(51) Int. Cl.
*H01G 4/005* (2006.01)
*H01G 4/224* (2006.01)
(52) U.S. Cl.
CPC ............. *H01G 4/005* (2013.01); *H01G 4/224* (2013.01)
(58) Field of Classification Search
CPC ........ H01G 4/005; H01G 4/224; H01G 2/065; H05K 2201/10015; H01L 23/642
See application file for complete search history.

(56) References Cited

U.S. PATENT DOCUMENTS

| 7,564,085 | B2 | 7/2009 | Jang et al. |
| 7,608,877 | B2 * | 10/2009 | Shioya .................. H10B 12/03 |
| | | | 257/532 |
| 7,875,920 | B2 | 1/2011 | Choi et al. |
| 7,906,803 | B2 * | 3/2011 | Shioya ................ H01L 29/0676 |
| | | | 257/532 |
| 8,988,857 | B2 | 3/2015 | McConnell et al. |
| 9,692,386 | B2 | 6/2017 | Zuo et al. |
| 9,905,501 | B2 | 2/2018 | Sugaya et al. |
| 2008/0218939 | A1 | 9/2008 | Marcus et al. |
| 2015/0016016 | A1 | 1/2015 | Lee |
| 2015/0221592 | A1 | 8/2015 | Verma et al. |
| 2023/0245828 | A1 * | 8/2023 | Park ........................ H01L 24/48 |
| | | | 257/737 |
| 2023/0319998 | A1 * | 10/2023 | Park ........................ H01G 4/012 |
| 2024/0006122 | A1 * | 1/2024 | Park ......................... H01G 4/10 |
| 2024/0021663 | A1 * | 1/2024 | Park ........................ H01L 28/60 |

FOREIGN PATENT DOCUMENTS

| KR | 1020140039653 A | 4/2014 |
| KR | 102042734 B1 | 11/2019 |
| KR | 1020230116281 A | 8/2023 |

* cited by examiner

*Primary Examiner* — Nathan Milakovich
(74) *Attorney, Agent, or Firm* — Muir Patent Law, PLLC

(57) ABSTRACT

A chip capacitor includes a substrate, a plurality of capacitor wires on the substrate, and a mold layer disposed on the substrate to cover the capacitor wires. Each of the capacitor wires includes a core electrode line having a wire shape, an outer electrode line covering at least a portion of the core electrode line, and a dielectric line interposed between the core electrode line and the outer electrode line.

20 Claims, 17 Drawing Sheets

CHIP CAPACITOR INCLUDING CAPACITOR WIRES

CROSS-REFERENCE TO RELATED APPLICATIONS

This U.S. non-provisional patent application claims priority under 35 U.S.C. § 119 to Korean Patent Application No. 10-2022-0038397, filed on Mar. 28, 2022, in the Korean Intellectual Property Office, the entire contents of which are hereby incorporated by reference.

BACKGROUND OF THE INVENTION

The present disclosure relates to a chip capacitor including capacitor wires.

To realize a high-performance electronic device with several functions, a plurality of active and passive components are mounted on a surface of a wiring board. The passive components are used for effective signal exchange between the active components and may include resistors, inductors, capacitors, and so forth. For example, to realize a high-performance electronic device, a plurality of capacitors may be mounted on the wiring board, and in this case, a mounting area of the capacitors on the wiring board may be increased. Many studies are being conducted to reduce the mounting area of the capacitor on the wiring board and to improve the performance of the capacitor.

SUMMARY

Embodiments of the inventive concept provide a chip capacitor that can be easily scaled down.

Embodiments of the inventive concept provide a chip capacitor having high performance and high reliability characteristics.

According to an embodiment of the inventive concept, a chip capacitor may include a substrate, a plurality of capacitor wires on the substrate, and a mold layer disposed on the substrate to cover the capacitor wires. Each of the capacitor wires may include a core electrode line having a wire shape, an outer electrode line covering at least a portion of the core electrode line, and a dielectric line interposed between the core electrode line and the outer electrode line.

According to an embodiment of the inventive concept, a chip capacitor may include a substrate having a top surface and a bottom surface, which are opposite to each other, the substrate including first substrate pads at the top surface and second substrate pads at the bottom surface, a plurality of capacitor wires, which are disposed on the top surface of the substrate and are connected to the first substrate pads, and a mold layer, which is disposed on the top surface of the substrate to cover the capacitor wires. Each of the capacitor wires may include a core electrode line having a wire shape, an outer electrode line covering at least a portion of the core electrode line, and a dielectric line interposed between the core electrode line and the outer electrode line. Each of the capacitor wires may have a first end portion and a second end portion, which are opposite to each other in a longitudinal direction of the core electrode line. At the first end portion of each of the capacitor wires, the core electrode line may be connected to one of the first substrate pads. At the second end portion of each of the capacitor wires, the outer electrode line may be connected to another of the first substrate pads.

DETAILED DESCRIPTION

Example embodiments of the inventive concepts will now be described more fully with reference to the accompanying drawings, in which example embodiments are shown.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
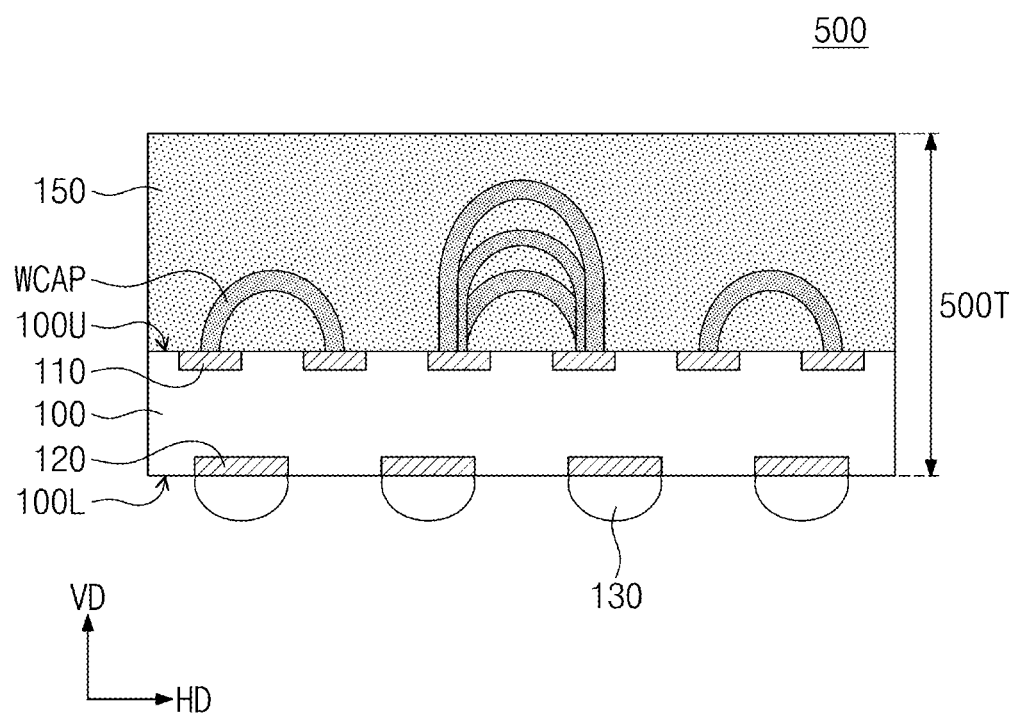
FIG. 1 is a sectional view illustrating a chip capacitor according to an embodiment of the inventive concept.
Figure 2:
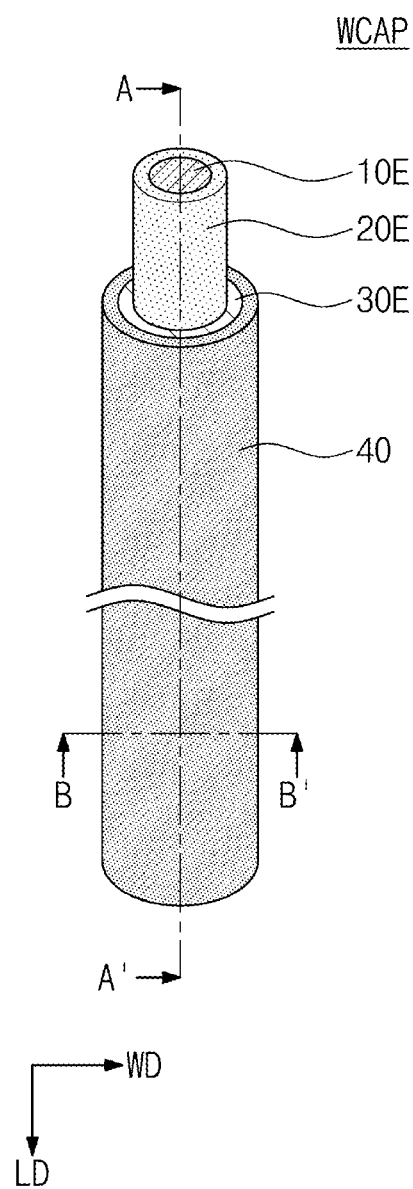
FIG. 2 is a schematic perspective view of a capacitor wire of FIG. 1.
Figure 3A:
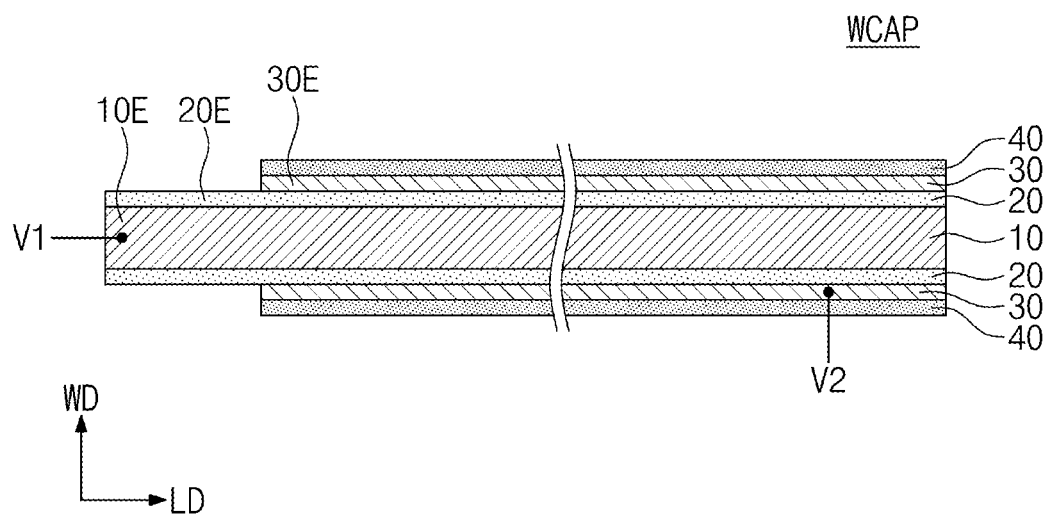
FIG. 3A is a sectional view taken along a line A-A' of FIG. 2.
Figure 3B:
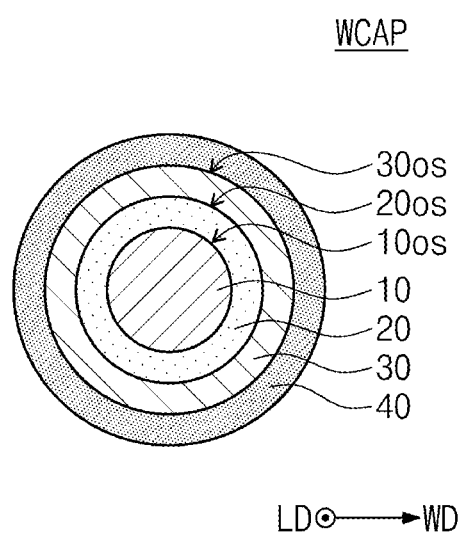
FIG. 3B is a sectional view taken along a line B-B' of FIG. 2.
Figure 4:
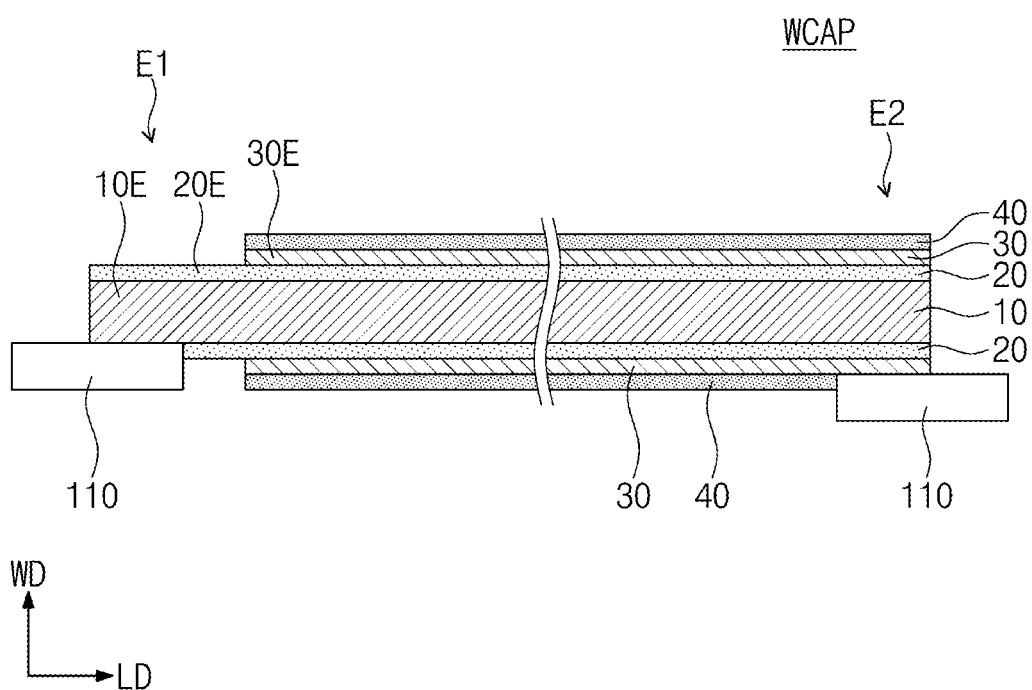
FIG. 4 is a conceptual diagram illustrating a method of bonding the capacitor wire of FIG. 2.

FIG. 1 is a sectional view illustrating a chip capacitor according to an embodiment of the inventive concept. FIG. 2 is a perspective view schematically illustrating a capacitor wire of FIG. 1, FIG. 3A is a sectional view taken along a line A-A' of FIG. 2, and FIG. 3B is a sectional view taken along a line B-B' of FIG. 2. FIG. 4 is a conceptual diagram illustrating a method of bonding the capacitor wire of FIG. 2.

Referring to FIG. 1, a chip capacitor 500 may include a substrate 100, a plurality of capacitor wires WCAP mounted on the substrate 100, and a mold layer 150 disposed on the substrate 100 to cover the capacitor wires WCAP.

The substrate 100 may include a top surface 100U and a bottom surface 100L, which are opposite to each other. The substrate 100 may include first substrate pads 110 at or adjacent to the top surface 100U of the substrate 100 and second substrate pads 120 at or adjacent to the bottom surface 100L of the substrate 100, and the first substrate pads 110 may be electrically connected to the second substrate pads 120 through internal lines in the substrate 100. A top surface 100U of the substrate 100 and top surfaces of the first substrate pads 110 may be coplanar (e.g., at the same vertical level) or may be on different planes. A bottom surface 100L of the substrate 100 and bottom surfaces of the second substrate pads 120 may be coplanar (e.g., at the same vertical level) or on different planes. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements otherwise. The first and second substrate pads 110 and 120 may be formed of or include at least one of conductive materials (e.g., metallic materials). In an embodiment, the substrate 100 may be a printed circuit board, an interposer substrate, or a redistribution substrate.

The capacitor wires WCAP may be mounted on the top surface 100U of the substrate 100 and may be electrically connected to the first substrate pads 110. Each of the capacitor wires WCAP may be connected to corresponding ones of the first substrate pads 110 by a wire bonding method. Some of the capacitor wires WCAP may be mounted on the substrate 100 to be spaced apart from each other in a horizontal direction HD, which is parallel to the top surface 100U of the substrate 100, and others of the capacitor wires WCAP may be mounted on the substrate 100 to be stacked in a vertical direction VD, which is perpendicular to the top surface 100U of the substrate 100 so that they overlap from a plan view.

Referring to FIGS. 2, 3A, and 3B, each of the capacitor wires WCAP may include a core electrode line 10, an outer electrode line 30 covering at least a portion of the core electrode line 10, a dielectric line 20 interposed between the core and outer electrode lines 10 and 30, and a passivation line 40 covering at least a portion of the outer electrode line 30. The different lines described herein may also be described as layers.

The core electrode line 10 may have a wire shape and may be elongated in a specific direction. The specific direction may be referred to as a longitudinal direction LD of the core electrode line 10, and a direction perpendicular to the longitudinal direction LD may be referred to as a width direction WD. In an embodiment, as shown in FIG. 3B, the core electrode line 10 may have a rounded shape (e.g., a circular shape), when viewed in a sectional view taken in the width direction WD. In another embodiment, unlike that illustrated in the drawings, the core electrode line 10 may have a tetragonal shape (e.g., a rectangular shape), when viewed in a sectional view taken in the width direction WD. The core electrode line 10 may be formed of or may include a first metal, and for example, the first metal may include at least one of Au, Ag, Pd, Cu, or Al.

The dielectric line 20 may cover at least a portion of the core electrode line 10 and may extend in the longitudinal direction LD between the core and outer electrode lines 10 and 30. The dielectric line 20 may enclose an outer circumference surface 10os of the core electrode line 10 and may extend along the outer circumference surface 10os of the core electrode line 10 or in the longitudinal direction LD. The dielectric line 20 may be formed of or include at least one of ceramics materials (e.g., aluminum oxide ($Al_2O_3$)).

The outer electrode line 30 may cover at least a portion of the dielectric line 20 and may be extended in the longitudinal direction LD between the dielectric line 20 and the passivation line 40. The outer electrode line 30 may enclose an outer circumference surface 20os of the dielectric line 20 and may be extended along the outer circumference surface 20os of the dielectric line 20 or in the longitudinal direction LD. The outer electrode line 30 may be electrically disconnected or isolated from the core electrode line 10 by the dielectric line 20.

The outer electrode line 30 may be formed at least one of materials (e.g., metal alloys) having melting points lower than the core electrode line 10. In addition, the outer electrode line may be formed at least one of materials (e.g., metal alloys) having mechanical strengths smaller than the core electrode line 10. As an example, the outer electrode line 30 may be formed of or include a second metal, which is different from the first metal, or an alloy of the second metal. In an embodiment, the outer electrode line 30 may be formed of or include at least one of arsenic-copper alloys, aluminum-cerium alloys, aluminum-scandium alloys, silver-germanium alloys, silver-palladium alloys, aluminum-indium alloys, field's metals, arsenic-antimony alloys, aluminum-magnesium alloys, magnesium-praseodymium alloys, arsenic-tin alloys, aluminum-silicon alloys, gold-magnesium alloys, aluminum-gold alloys, silver-aluminum alloys, gold-lanthanum alloys, aluminum-copper alloys, silver-calcium alloys, aluminum-calcium alloys, silver-arsenic alloys, silver-cerium alloys, gold-cerium alloys, silver-lanthanum alloys, magnesium-nickel alloys, gold-cadmium alloys, silver-antimony alloys, silver-magnesium alloys, silver-strontium alloys, Babbitt metals, aluminum-germanium alloys, magnesium-strontium alloys, gold-tellurium alloys, aluminum-zinc alloys, gold-silicon alloys, gold-antimony alloys, gold-germanium alloys, silver-tellurium alloys, magnesium-zinc alloys, or silver-lead alloys.

The passivation line 40 may cover at least a portion of the outer electrode line 30 and may extend in the longitudinal direction LD, on the outer electrode line 30. The passivation line 40 may enclose an outer circumference surface 30os of the outer electrode line 30 and may extend along the outer circumference surface 30os of the outer electrode line 30 and in the longitudinal direction LD. The outer electrode line 30 may be interposed between the dielectric line 20 and the passivation line 40. The passivation line 40 may be formed of or include at least one of insulating or ceramic materials (e.g., aluminum oxide ($Al_2O_3$)) or metallic materials (e.g., Au, Ni, and Pd).

An end portion 10E of the core electrode line 10 may be enclosed by an end portion 20E of the dielectric line 20. The end portion 20E of the dielectric line 20 may not be covered with the outer electrode line 30 and the passivation line 40 and may be exposed to the outside. An end portion 30E of the outer electrode line 30 may be adjacent to the end portion 20E of the dielectric line 20 and may be covered with the passivation line 40.

A first voltage V1 may be applied to the core electrode line 10 through the end portion 10E (e.g., a terminal portion) of the core electrode line 10, and a second voltage V2 may be applied to the outer electrode line 30. The first and second voltages V1 and V2 may be different from each other. As an example, one of the first and second voltages V1 and V2 may be a power voltage, and the other of the first and second voltages V1 and V2 may be a ground voltage. The first voltage V1 may be supplied, for example, from a power source, which may connect to the end portion 10E of the core electrode line 10 through one or more wires or other conductive components. The second voltage V2 may be supplied, for example, from a ground node which may connect to an opposite end portion of the outer electrode line 30 through one or more wires or conductive components. Since the core and outer electrode lines 10 and 30 are applied with different voltages, electric charges may be accumulated in the dielectric line 20. Each of the capacitor wires WCAP may be a capacitor having a wire shape.

Referring to FIGS. 1 and 4, each of the capacitor wires WCAP may be connected to the corresponding first substrate pads 110 by a wire bonding method. Each of the capacitor wires WCAP may have a first end portion E1 and a second end portion E2, which are opposite to each other in the longitudinal direction LD. In the first end portion E1 of each of the capacitor wires WCAP, the end portion 10E of the core electrode line 10 may be connected to one of the corresponding first substrate pads 110 by a ball bonding method or a wedge bonding method. The first end portion E1 of each of the capacitor wires WCAP may include the end portion 30E of the outer electrode line 30, and the second end portion E2 of each of the capacitor wires WCAP may include an opposite end portion of the outer electrode line 30. In the second end portion E2 of each of the capacitor wires WCAP, the opposite end portion of the outer electrode line 30 may be connected to another of the corresponding first substrate pads 110 by a wedge bonding method. As can be seen in FIG. 4, at the first end portion E1, the outer electrode line 30 does not contact any first substrate pad 110, and therefore is not electrically connected to a first substrate pad at the first end portion E1. Similarly, at the second end portion E2, the core electric line 10 is insulated from any first substrate pads and does not contact and is not electrically connected to a first substrate pad at the second end portion.

Referring back to FIG. 1, the mold layer 150 may be provided to encapsulate or seal the capacitor wires WCAP. The mold layer 150 may be formed of or include at least one of insulating materials (e.g., epoxy molding compounds).

The chip capacitor 500 may further include lower connection terminals 130, which are respectively disposed on the second substrate pads 120 of the substrate 100. The lower connection terminals 130 may be electrically connected to the second substrate pads 120, respectively. The lower connection terminals 130 may include at least one of pillars, bumps, and solder balls and may be formed of or include a conductive material. The lower connection terminals 130 may be electrically connected to outer terminals, and may connect the chip capacitor 500 to other components of a circuit, for example, formed on a circuit board.

The chip capacitor 500 may be a chip-type capacitor, in which the capacitor wires WCAP are provided. The chip capacitor 500 may have a thickness in the vertical direction VD, and a thickness 500T of the chip capacitor 500 may be equal to or smaller than 1 mm. The chip capacitor 500 may be electrically connected to outer terminals through the second substrate pads 120 and the lower connection terminals 130 of the substrate 100.

According to an embodiment of the inventive concept, the chip capacitor 500 may be a chip-type capacitor, in which the capacitor wires WCAP are provided. Since each of the capacitor wires WCAP has a wire shape, it may be possible to easily reduce a size of each of the capacitor wires WCAP, and in this case, it may be possible to reduce a size of the chip capacitor 500 and to increase an integration density of the capacitor wires WCAP provided in the chip capacitor 500. As a result, it may be easy to reduce a size of the chip capacitor 500 and to increase an electrostatic capacitance of the chip capacitor 500. In addition, since each of the capacitor wires WCAP is mounted on the substrate 100 by a wire bonding method, the capacitor wires WCAP may be easily mounted on the substrate 100. As a result, it may be possible to easily improve reliability of the chip capacitor 500.

Accordingly, it may be possible to provide the chip capacitor 500, which can be easily scaled down and has high performance and high reliability characteristics.

FIGS. 5 to 12 are conceptual diagrams exemplarily illustrating various methods of mounting the capacitor wire of FIG. 1.

Referring to FIGS. 5 to 8, a capacitor wire WCAP may be connected to corresponding ones of the first substrate pads 110 of the substrate 100 by a wire bonding method. The capacitor wire WCAP may have a first end portion E1 and a second end portion E2, which are opposite to each other in an elongation or length direction of the capacitor wire WCAP. The first and second end portions E1 and E2 of the capacitor wire WCAP may be connected to the corresponding first substrate pads 110 by a ball bonding method or a wedge bonding method, as described with reference to FIG. 4. The capacitor wire WCAP connected to the corresponding first substrate pads 110 may have an arch shape, so that least part of the capacitor wire WCAP is separated from the substrate 100 (e.g., a gap may be formed between part of the capacitor wire WCAP and the substrate 110). In addition, though not shown, in some embodiments, a horizontal gap may be formed between the first substrate pad 110 and the dielectric line 20 at the first end portion E1, so that the capacitor wire WCAP can be bent away from the top surface of the first substrate pad 110 and top surface of the substrate 100 at the first end portion E1, for example, when those top surfaces are coplanar. Similarly, a horizontal gap may be formed between the first substrate pad 110 and the passivation line 40 at the second end portion E2, so that the capacitor wire WCAP can be bent away from the top surface of the first substrate pad 110 and top surface of the substrate 100 at the second end portion E2, for example, when those top surfaces are coplanar. In addition, in some embodiments, top surfaces of the first substrate pads 110 are above a top surface of the substrate 100 (as depicted in various other figures).

Figure 5:
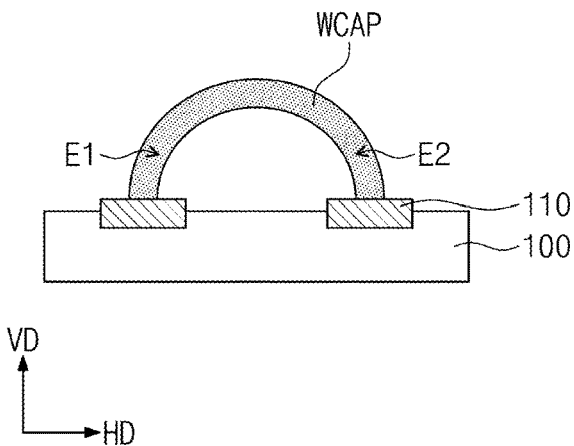
FIGS. 5 to 12 are conceptual diagrams exemplarily illustrating various methods of mounting the capacitor wire of FIG. 1.
Figure 6:
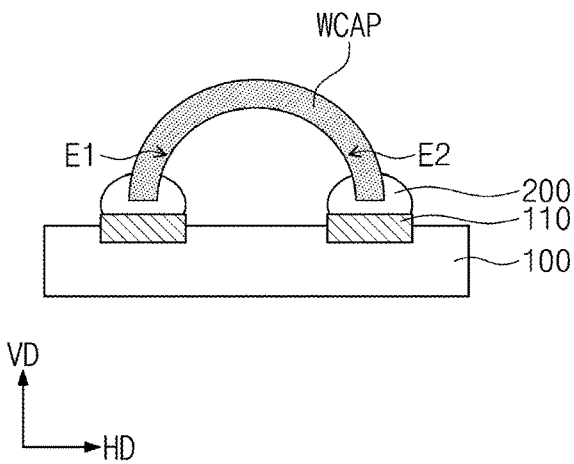
Figure 7:
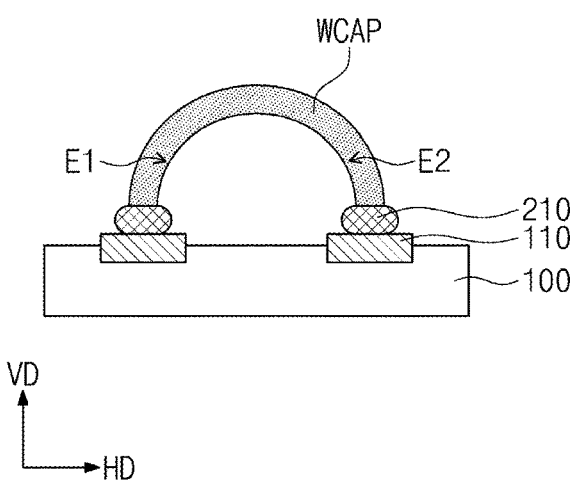
Figure 8:
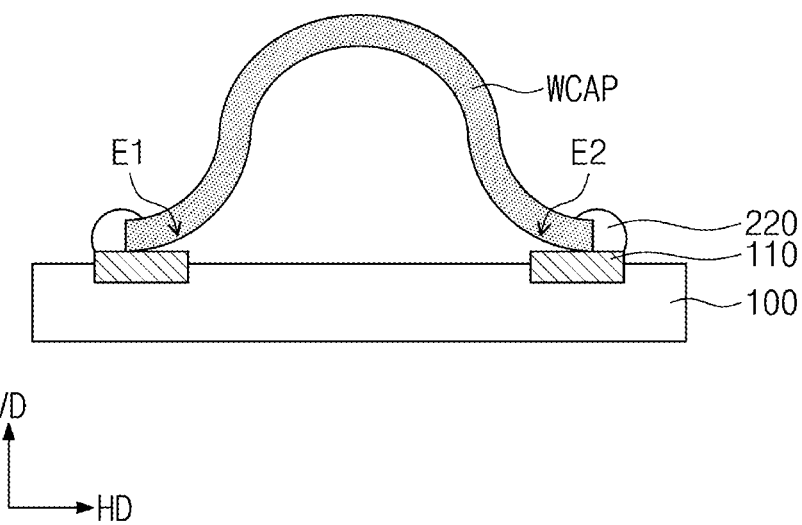

In an embodiment, as shown in FIG. 5, the first and second end portions E1 and E2 of the capacitor wire WCAP may contact the corresponding first substrate pads 110. For example, as described with reference to FIG. 4, in the first end portion E1 of the capacitor wire WCAP, the end portion 10E of the core electrode line 10 may contact one of the corresponding first substrate pads 110 by a ball bonding method or a wedge bonding method. In the second end portion E2 of the capacitor wire WCAP, the opposite end portion of the outer electrode line 30 may contact another of the corresponding first substrate pads 110 by a wedge bonding method. In another embodiment, as shown in FIG. 6, a solder ball 200 may be interposed between each of the first and second end portions E1 and E2 of the capacitor wire WCAP and each of the corresponding first substrate pads 110 so that the first and second end portions E1 and E2 of the capacitor wire WCAP connect to each of the corresponding first substrate pads 110 through a solder ball 200. For example, as described with reference to FIG. 4, in the first end portion E1 of the capacitor wire WCAP, the end portion 10E of the core electrode line 10 may be connected to one of the corresponding first substrate pads 110 through the solder ball 200 by a ball bonding method or a wedge bonding method. In the second end portion E2 of the capacitor wire WCAP, the opposite end portion of the outer electrode line 30 may be connected to another of the corresponding first substrate pads 110 through the solder ball 200 by a wedge bonding method. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The solder ball 200 may be formed of or include at least one of conductive materials (e.g., metallic materials). A portion of each of the first and second end portions E1 and E2 of the capacitor wire WCAP may be inserted into the solder ball 200. In other embodiment, as shown in FIG. 7, a conductive bump 210 may be interposed between each of the first and second end portions E1 and E2 of the capacitor wire WCAP and each of the corresponding first substrate pads 110. For example, as described with reference to FIG. 4, in the first end portion E1 of the capacitor wire WCAP, the end portion 10E of the core electrode line 10 may be connected to one of the corresponding first substrate pads 110 through the conductive bump 210 by a ball bonding method or a wedge bonding method. In the second end portion E2 of the capacitor wire WCAP, the opposite end portion of the outer electrode line 30 may be connected to another of the corresponding first substrate pads 110 through conductive bump 210 by a wedge bonding method. The conductive bump 210 may be formed of or include at least one of conductive materials (e.g., metallic materials). In still other embodiment, as shown in FIG. 8, the first and second end portions E1 and E2 of the capacitor wire WCAP may contact the corresponding first substrate pads 110, and reinforcing patterns 220 may be disposed on the corresponding first substrate pads 110, respectively. For example, as described with reference to FIG. 4, in the first end portion E1 of the capacitor wire WCAP, the end portion 10E of the core electrode line 10 may contact one of the corresponding first substrate pads 110 by a ball bonding method or a wedge bonding method. In the second end portion E2 of the capacitor wire WCAP, the opposite end portion of the outer electrode line 30 may contact another of the corresponding first substrate pads 110 by a wedge bonding method. The reinforcing patterns 220 may be provided to cover the first and second end portions E1 and E2, respectively, of the capacitor wire WCAP. The reinforcing patterns 220 may be formed of or include at least one of conductive materials (e.g., metallic materials).

Figure 9:
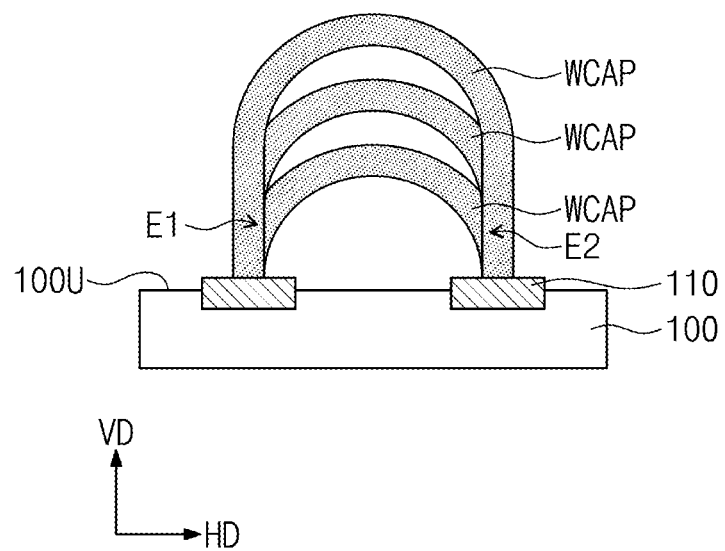
Figure 10:
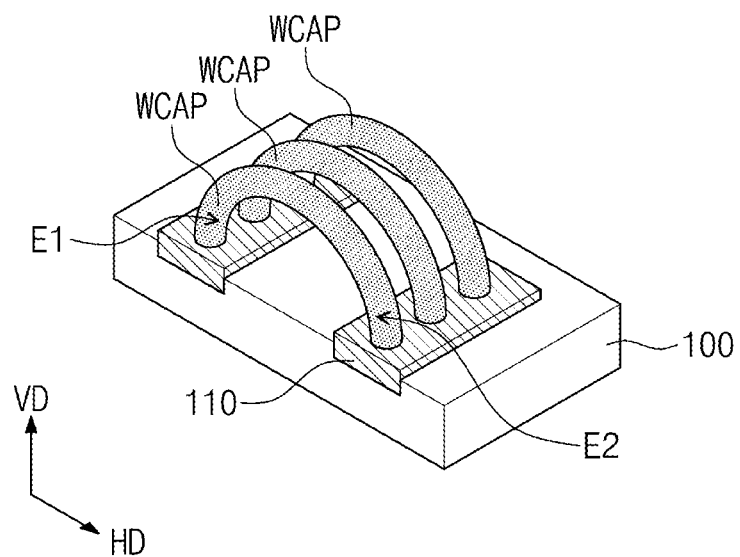
Figure 11:
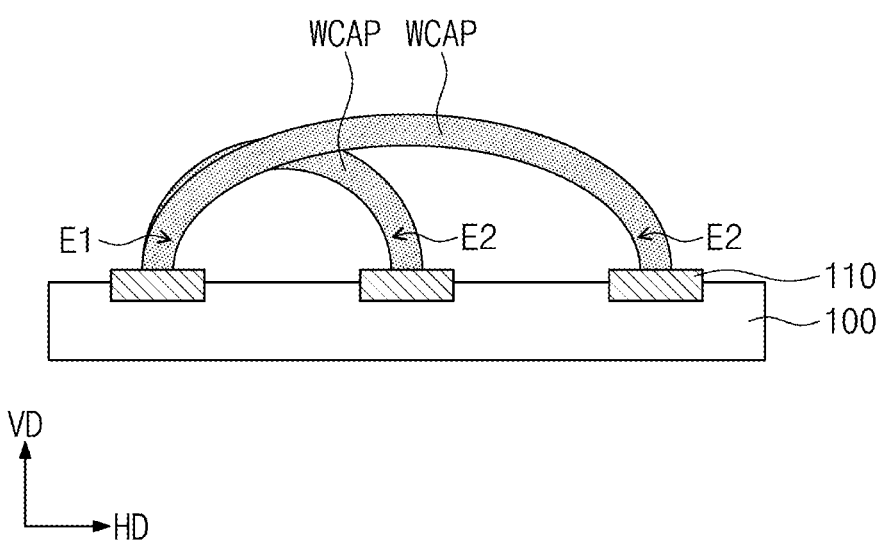

Referring to FIGS. 9 to 11, a plurality of capacitor wires WCAP may be connected to the corresponding first substrate pads 110 by a wire bonding method. Each of the capacitor wires WCAP, connected to the corresponding first substrate pads 110, may include an arch-shaped portion.

In an embodiment, as shown in FIG. 9, first end portions E1 of the capacitor wires WCAP may be connected in common to one of the corresponding first substrate pads 110, and second end portions E2 of the capacitor wires WCAP may be connected in common to another of the corresponding first substrate pads 110. For example, in the first end portions E1 of the capacitor wires WCAP, as described with reference to FIG. 4, the end portions 10E of the core electrode lines 10 may be connected in common to one of the corresponding first substrate pads 110 by a ball bonding method or a wedge bonding method. In the second end portions E2 of the capacitor wires WCAP, the opposite end portions of the outer electrode lines 30 may be connected in common to another of the corresponding first substrate pads 110 by a wedge bonding method. The capacitor wires WCAP may have different lengths from each other and may be mounted on the corresponding first substrate pads 110 to be spaced apart from each other in the vertical direction VD.

In another embodiment, as shown in FIG. 10, first end portions E1 of the capacitor wires WCAP may be connected in common to one of the corresponding first substrate pads 110, and second end portions E2 of the capacitor wires WCAP may be connected in common to another of the corresponding first substrate pads 110. For example, in the first end portions E1 of the capacitor wires WCAP, as described with reference to FIG. 4, the end portions 10E of the core electrode lines 10 may be connected in common to one of the corresponding first substrate pads 110 by a ball bonding method or a wedge bonding method. In the second end portions E2 of the capacitor wires WCAP, the opposite end portions of the outer electrode lines 30 may be connected in common to another of the corresponding first substrate pads 110 by a wedge bonding method. The capacitor wires WCAP may have the same length and may be mounted on the corresponding first substrate pads 110 to be spaced apart from each other in the horizontal direction HD. It should be noted that the capacitor wires WCAP of FIG. 10 may also be spaced apart from each other in a vertical direction VD when viewed from a sectional view, so that the sectional view would look like FIG. 9.

In other embodiments, as shown in FIG. 11, first end portions E1 of the capacitor wires WCAP may be connected in common to one of the corresponding first substrate pads 110, and second end portions E2 of the capacitor wires WCAP may be respectively connected to different ones of the corresponding first substrate pads 110. For example, in the first end portions E1 of the capacitor wires WCAP, as described with reference to FIG. 4, the end portions 10E of the core electrode lines 10 may be connected in common to one of the corresponding first substrate pads 110 by a ball bonding method or a wedge bonding method. In the second end portions E2 of the capacitor wires WCAP, the opposite end portions of the outer electrode lines 30 may be connected to different ones of the corresponding first substrate pads 110 by a wedge bonding method. In this case, a ground voltage may be applied in common to the capacitor wires WCAP, and different power voltages may be applied to the capacitor wires WCAP, respectively. In one embodiment, the two wires may be horizontally spaced apart from each other as well.

Figure 12:
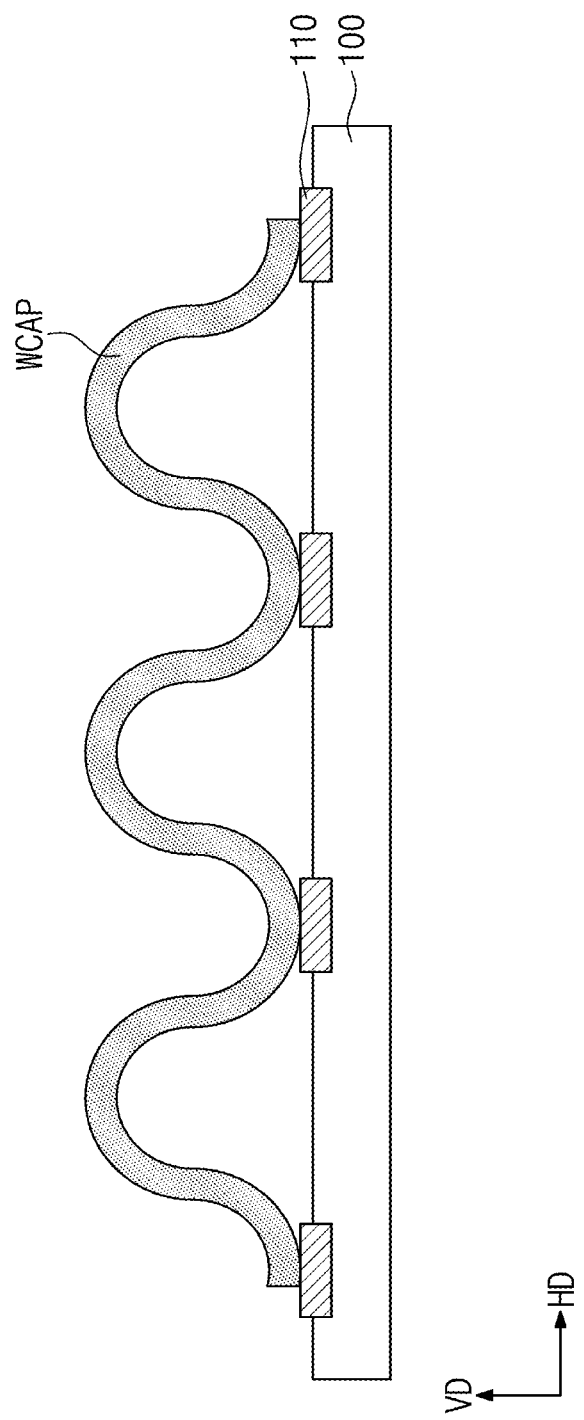

Referring to FIG. 12, a capacitor wire WCAP may be connected to the corresponding first substrate pads 110 by a stitch bonding method. In this case, the capacitor wire WCAP may include outer electrode segments, which are extended to be spaced apart from each other in an elongation direction (e.g., the longitudinal direction LD) of the capacitor wire WCAP. The outer electrode line 30, which is described with reference to FIGS. 2 to 4, may be divided into the outer electrode segments in the longitudinal direction LD of the core electrode line 10. For example, in one end portion of the capacitor wire WCAP, as described with reference to FIG. 4, the end portion 10E of the core electrode line 10 may be connected to one of the corresponding first substrate pads 110 by a ball bonding method or a wedge bonding method. The outer electrode segments of the capacitor wire WCAP may be respectively connected to others of the corresponding first substrate pads 110 by a stitch bonding method. In this case, the core electrode line 10 may be shared by the outer electrode segments. The capacitor wire WCAP, which is connected to the corresponding first substrate pads 110, may include a plurality of arch-shaped portions.

Figure 13:
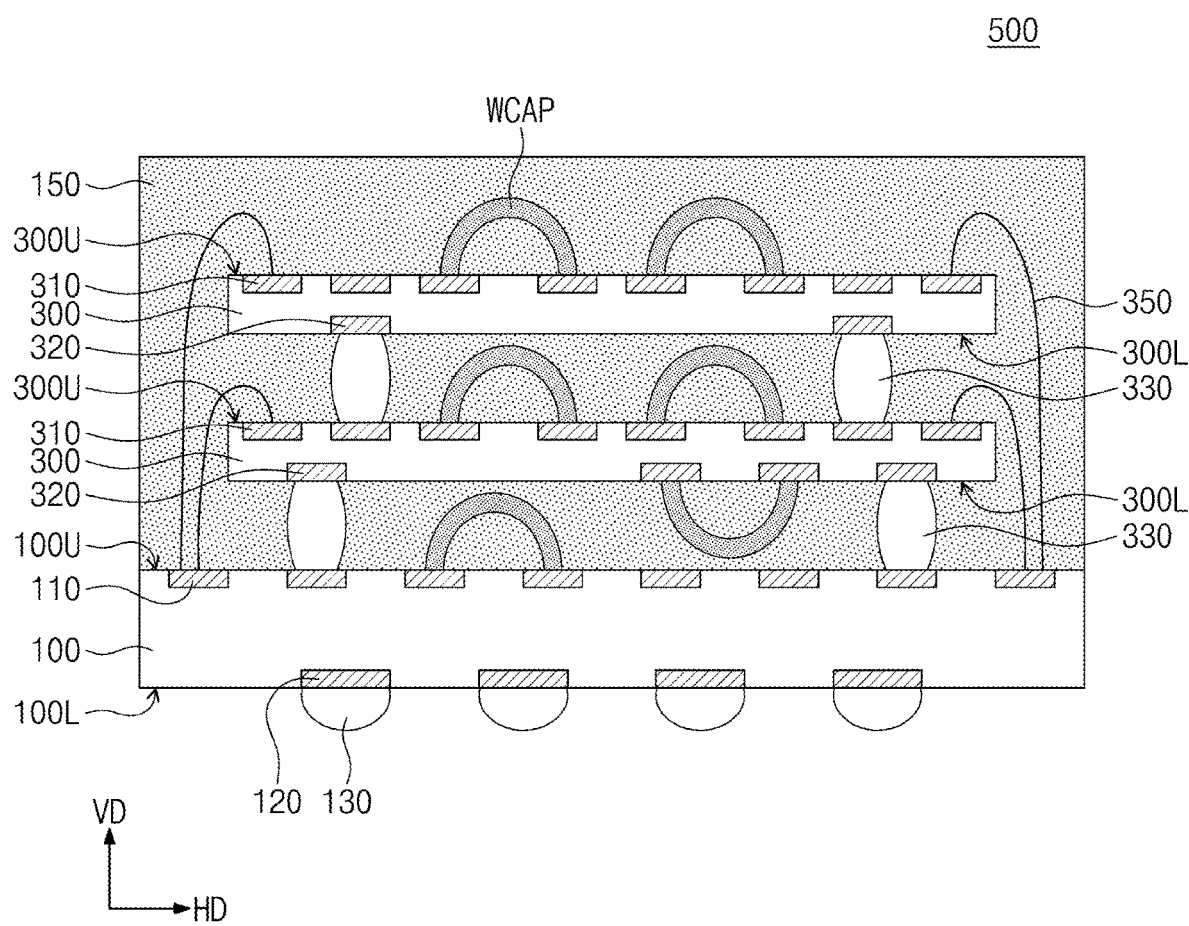
FIGS. 13 to 16 are sectional views, each of which illustrates a chip capacitor according to an embodiment of the inventive concept.

FIG. 13 is a sectional view illustrating a chip capacitor according to an embodiment of the inventive concept. For the sake of brevity, the same element as in the chip capacitor described with reference to FIGS. 1 to 4 may be identified by the same reference number without repeating an overlapping description thereof.

Referring to FIG. 13, a chip capacitor 500 may further include at least one upper substrate 300 stacked on the substrate 100. The upper substrate 300 may be spaced apart from the substrate 100 in the vertical direction VD. In an embodiment, a plurality of upper substrates 300 may be stacked on the substrate 100 in the vertical direction VD. The upper substrates 300 may be spaced apart from the substrate 100 in the vertical direction VD and may be spaced apart from each other in the vertical direction VD.

Each upper substrate 300 may have a top surface 300U and a bottom surface 300L, which are opposite to each other. The upper substrate 300 may include first upper substrate pads 310, which are at or adjacent to the top surface 300U of the upper substrate 300, and second upper substrate pads 320, which are at or adjacent to the bottom surface 300L of the upper substrate 300. A top surface of 300U of the upper substrate 300 and top surfaces of the first upper substrate pads 310 may be coplanar or in different planes, and a bottom surface 300L of the upper substrate 300 and bottom surfaces of the second upper substrate pads 320 may be coplanar or on different planes. The first upper substrate pads 310 may be electrically connected to the second upper substrate pads 320 through internal lines in the upper substrate 300. The first and second upper substrate pads 310 and 320 may be formed of or include at least one of conductive materials (e.g., metallic materials). In an embodiment, the upper substrate 300 may be a printed circuit board, an interposer substrate, or a redistribution substrate.

The capacitor wires WCAP may be mounted on a top surface 100U of the substrate 100 and the top and bottom surfaces 300U and 300L of the upper substrate 300. Some of the capacitor wires WCAP may be electrically connected to the first substrate pads 110 of the substrate 100 and may be connected to the first substrate pads 110 by a wire bonding method, including the methods described previously in connection with FIGS. 1-12. Others of the capacitor wires WCAP may be electrically connected to the first and second upper substrate pads 310 and 320 of the upper substrate 300 and may be connected to the first and second upper substrate pads 310 and 320 by a wire bonding method, including the methods described previously in connection with FIGS. 1-12. Some of the capacitor wires WCAP may be disposed between the substrate 100 and the upper substrate 300 (e.g., between the substrate 100 and a lowermost upper substrate 300). Some of the capacitor wires WCAP may be disposed between adjacent upper substrates 300.

In the case where the upper substrates 300 are stacked on the substrate 100, the capacitor wires WCAP may be mounted on the top surface 100U of the substrate 100 and the top and bottom surfaces 300U and 300L of each of the upper substrates 300. Some of the capacitor wires WCAP may be electrically connected to the first substrate pads 110 of the substrate 100 and may be connected to the first substrate pads 110 by a wire bonding method. Others of the capacitor wires WCAP may be electrically connected to the first and second upper substrate pads 310 and 320 of each of the upper substrates 300 and may be connected to the first and second upper substrate pads 310 and 320 by a wire bonding method. Some of the capacitor wires WCAP may be disposed between the lowermost upper substrate 300 and the substrate 100 and some may be disposed between adjacent upper substrates 300.

The chip capacitor 500 may further include upper connection terminals 330 between the substrate 100 and the upper substrates 300. The upper connection terminals 330 may be connected to corresponding ones of the first substrate pads 110 of the substrate 100 and may be connected to corresponding ones of the second upper substrate pads 320 of the upper substrate 300. The upper substrates 300 may be electrically connected to the substrate 100 through the upper connection terminals 330.

In the case where the upper substrates 300 are stacked on the substrate 100, the upper connection terminals 330 may be additionally disposed between the upper substrates 300. The upper connection terminals 330 may be connected to corresponding ones of the first upper substrate pads 310 of one of the upper substrates 300 and may be connected to corresponding ones of the second upper substrate pads 320 of another of the upper substrates 300. The upper substrates 300 may be electrically connected to each other through the upper connection terminals 330 and may be electrically connected to the substrate 100. The upper connection terminals 330 may include or may be at least one of pillars, bumps, and solder balls and may be formed of or include a conductive material.

The chip capacitor 500 may further include conductive wires 350, which are provided to electrically connect the substrate 100 to the upper substrate(s) 300. Each of the conductive wires 350 may be connected to a corresponding one of the first upper substrate pads 310 of the upper substrate 300 (or each of the upper substrates 300) and may be connected to a corresponding one of the first substrate pads 110 of the substrate 100. The upper substrate(s) 300 may be electrically connected to the substrate 100 through the conductive wires 350.

The mold layer 150 may be disposed on the substrate 100 to cover the upper substrate(s) 300. The mold layer 150 may be extended into a region between the substrate 100 and the upper substrates 300 to cover side surfaces of the upper connection terminals 330. The mold layer 150 may be provided between the substrate 100 and the upper substrates 300 to fill spaces between the capacitor wires WCAP and the upper connection terminals 330.

In the case where the upper substrates 300 are stacked on the substrate 100, the mold layer 150 may be extended into a region between the upper substrates 300 to cover side surfaces of the upper connection terminals 330 between the upper substrates 300. The mold layer 150 may be provided between the upper substrates 300 to fill spaces between the capacitor wires WCAP and the upper connection terminals 330. The mold layer 150 may be provided to encapsulate or seal the upper substrate(s) 300, the capacitor wires WCAP, the upper connection terminals 330, and the conductive wires 350.

Except for the afore-described features, the chip capacitor 500 in the present embodiment may be substantially the same as the chip capacitor described with reference to FIGS. 1 to 4. In the present embodiment, an integration density of the capacitor wires WCAP embedded in the chip capacitor 500 may be increased, and thus, it may be possible to easily increase an electrostatic capacitance of the chip capacitor 500.

For example, each capacitor wire WCAP of the chip capacitor 500 may be connected between two pads on a substrate (e.g., either two first upper substrate pads 310, two second upper substrate pads 320, or two substrate pads 110). Effectively, each of those pads is connected to the core electrode line 10 or the outer electrode lines 30 of each capacitor wire WCAP using the methods described previously in connection with FIGS. 1-12. Each of those pads may then be connected, through internal substrate wiring as well as connection terminals 330 and/or conductive wires 350 (or other connection components described in later embodiments), to a respective substrate pad 120 and lower connection terminal 130. The first voltage V1 described with reference to FIG. 3B is supplied to the core electrode line 10 of each capacitor wire WCAP through a first lower connection terminal 130 and one of the two pads. The second voltage V2 described with reference to FIG. 3B may be supplied to the outer electrode line 30 of each capacitor wire WCAP through a second lower connection terminal 130 and the other of the two pads. In this manner, each capacitor wire WCAP can be used as a capacitor. Also, according to these examples, a single chip capacitor 500 may include multiple different capacitors, which is constituted by the capacitor wires WCAP.

Figure 14:
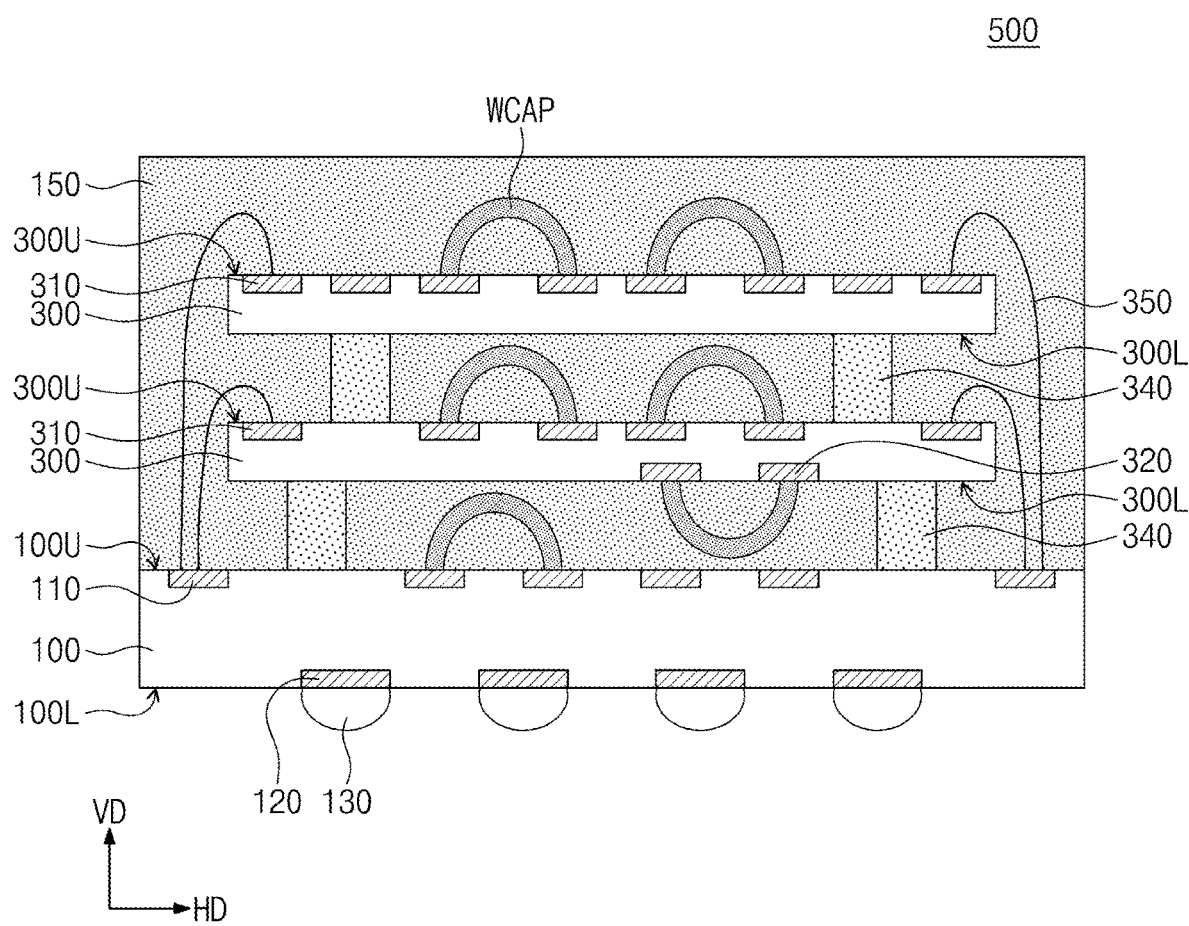

FIG. 14 is a sectional view illustrating a chip capacitor according to an embodiment of the inventive concept. For the sake of brevity, the same element as in the chip capacitor described with reference to FIG. 13 may be identified by the same reference number without repeating an overlapping description thereof.

Referring to FIG. 14, a chip capacitor 500 may further include supporting patterns 340 between the substrate 100 and the upper substrate 300. The supporting patterns 340 may be formed of or include an insulating material and may be disposed on the substrate 100 to support the upper substrate 300. In an embodiment, a plurality of upper substrates 300 may be stacked on the substrate 100 in the vertical direction VD, and the supporting patterns 340 may be additionally disposed between the upper substrates 300. The supporting patterns 340, also described as support posts or support pillars, may be used to support the upper substrates 300.

The mold layer 150 may be disposed on the substrate 100 to cover the upper substrate(s) 300. The mold layer 150 may extend into a region between the substrate 100 and the upper substrate 300 to cover side surfaces of the supporting patterns 340. The mold layer 150 may be provided between the substrate 100 and the upper substrate 300 to fill spaces between the capacitor wires WCAP and the supporting patterns 340.

In the case where the upper substrates 300 are stacked on the substrate 100, the mold layer 150 may extend into a region between the upper substrates 300 and may cover side surfaces of the supporting patterns 340 between the upper substrates 300. The mold layer 150 may be provided between the upper substrates 300 to fill spaces between the capacitor wires WCAP and the supporting patterns 340. The mold layer 150 may be provided to seal or encapsulate the upper substrate(s) 300, the capacitor wires WCAP, the supporting patterns 340, and the conductive wires 350.

Except for the afore-described features, the chip capacitor 500 in the present embodiment may be substantially the same as the chip capacitor described with reference to FIG. 13.

Figure 15:
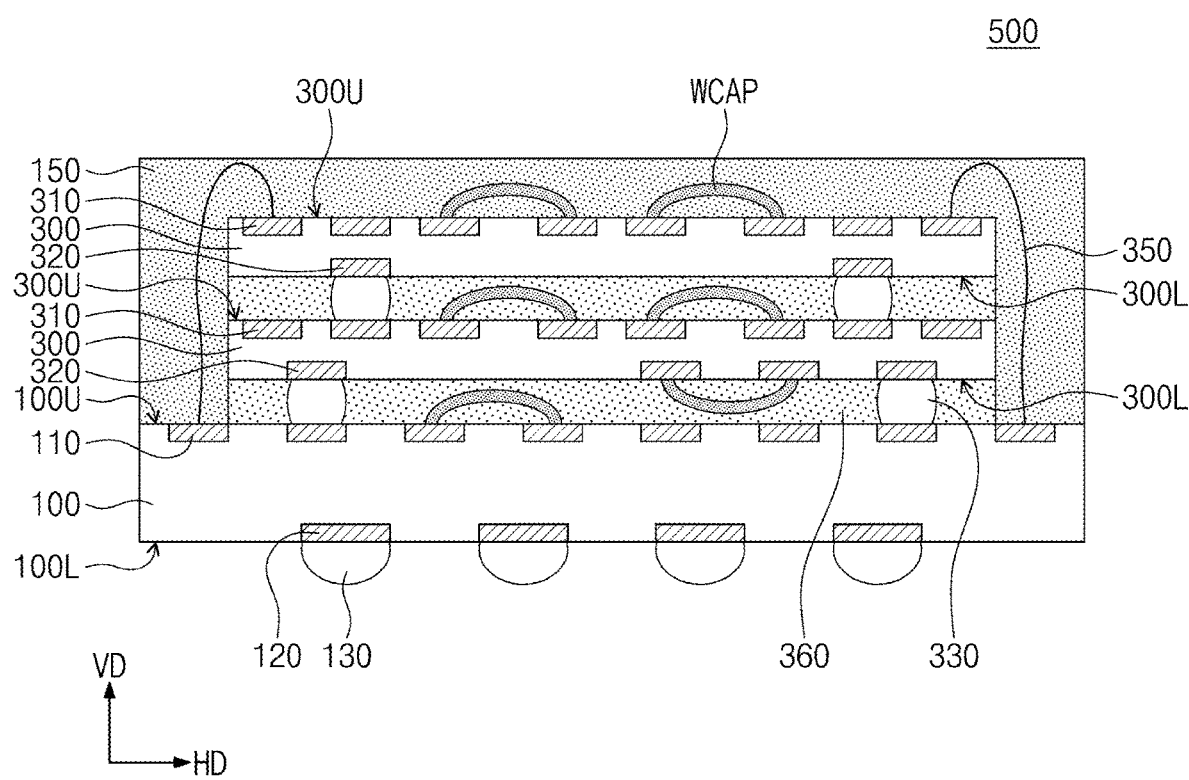

FIG. 15 is a sectional view illustrating a chip capacitor according to an embodiment of the inventive concept. For the sake of brevity, the same element as in the chip capacitor described with reference to FIG. 13 may be identified by the same reference number without repeating an overlapping description thereof.

Referring to FIG. 15, a chip capacitor 500 may further include an under fill layer 360 (or plurality of under fill layers) between the substrate 100 and the upper substrate 300. The under fill layer 360 may be provided between the substrate 100 and the upper substrate 300 to fill spaces between the capacitor wires WCAP and the upper connection terminals 330. In the case where the upper substrates 300 are stacked on the substrate 100, the under fill layer 360 may be additionally disposed between the upper substrates 300. The under fill layer 360 may be provided between the upper substrates 300 to fill spaces between the capacitor wires WCAP and the upper connection terminals 330. The under fill layer 360 may include an insulating polymer material (e.g., epoxy) or a non-conductive film (NCF).

The mold layer 150 may be disposed on the substrate 100 to cover the upper substrate(s) 300. The mold layer 150 may cover side surfaces of the upper substrate(s) 300 and the under fill layer 360. The mold layer 150 may be provided to seal or encapsulate the upper substrate(s) 300, the under fill layer 360, the capacitor wires WCAP, and the conductive wires 350.

Except for the afore-described features, the chip capacitor 500 in the present embodiment may be substantially the same as the chip capacitor described with reference to FIG. 13.

Figure 16:
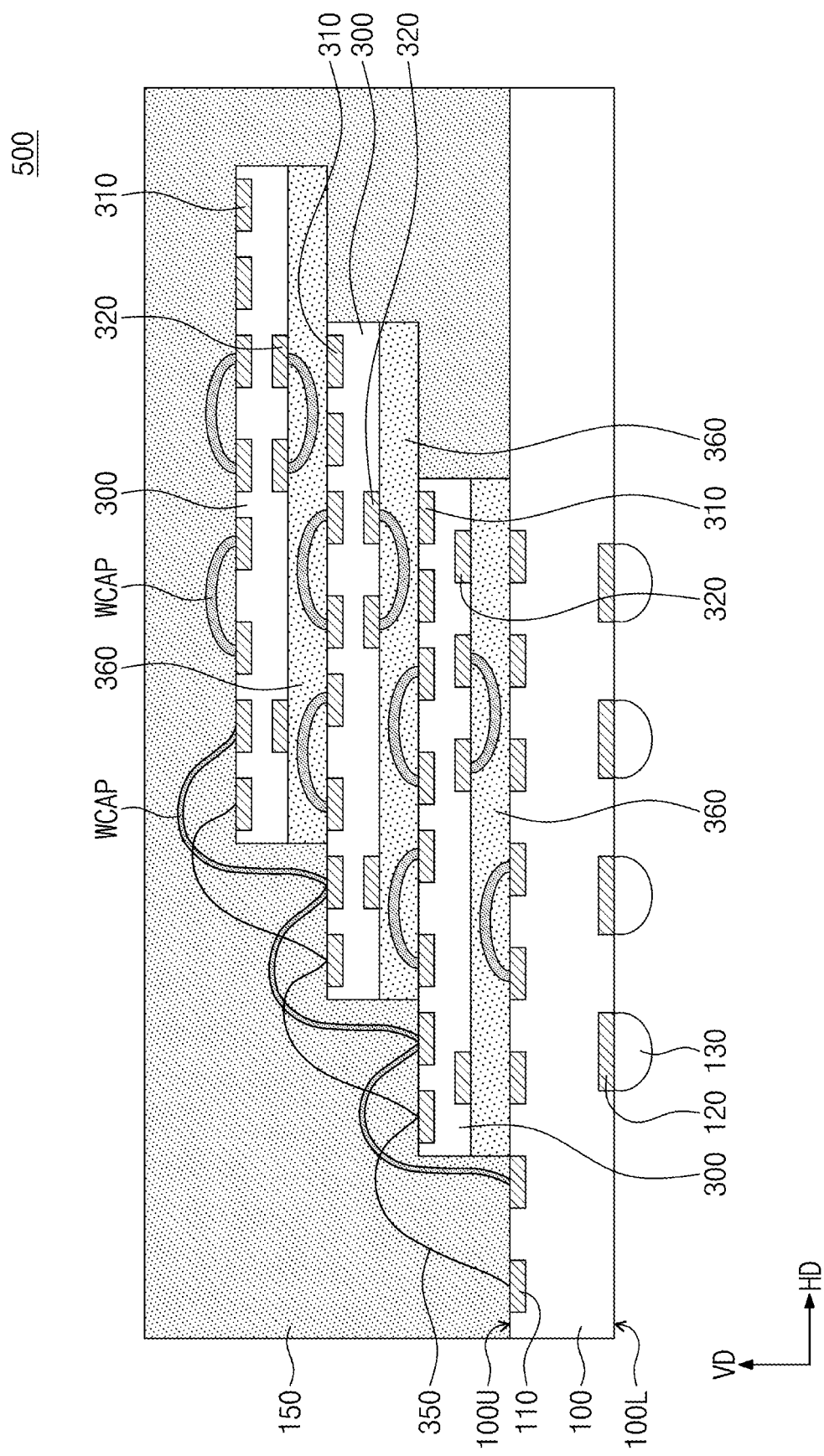

FIG. 16 is a sectional view illustrating a chip capacitor according to an embodiment of the inventive concept. For the sake of brevity, the same element as in the chip capacitor described with reference to FIG. 13 may be identified by the same reference number without repeating an overlapping description thereof.

Referring to FIG. 16, a chip capacitor 500 may include the upper substrates 300, which are stacked on the substrate 100 in the vertical direction VD, and in an embodiment, the upper substrates 300 may be stacked to form a staircase structure. The capacitor wires WCAP may be mounted on the top surface 100U of the substrate 100 and the top and bottom surfaces 300U and 300L of each of the upper substrates 300.

The chip capacitor 500 may further include an under fill layer 360, or plurality of under fill layers 360, which are provided between the upper substrates 300 and the substrate 100 and between the upper substrates 300. Between the upper substrates 300 and the substrate 100 and between the upper substrates 300, the under fill layer 360 may fill a space between the capacitor wires WCAP. The under fill layer 360 may be substantially the same as the under fill layer 360 of FIG. 15 and may include or may be, for example, a non-conductive film (NCF).

In an embodiment, a capacitor wire WCAP of at least one of the capacitor wires WCAP may be mounted on a portion of the staircase structure of the upper substrates 300 and may be connected to the upper substrates 300. In an embodiment, the at least one capacitor wire WCAP may be electrically connected to a corresponding first upper substrate pad 310 of one of the upper substrates 300 and a corresponding first upper substrate pad 310 of another of the upper substrates 300. In an embodiment, the at least one capacitor wire WCAP may be mounted to be continuously connected to the upper substrates 300 and the substrate 100 and may be continuously connected to corresponding first upper substrate pads 310 of the upper substrates 300 and a corresponding first substrate pad 110 of the substrate 100.

The chip capacitor 500 may further include a conductive wire 350, which is provided to electrically connect the substrate 100 to the upper substrates 300. The conductive wire 350 may be mounted on a portion of the staircase structure of the upper substrates 300 and may be connected to the upper substrates 300. In an embodiment, the conductive wire 350 may be electrically connected to a corresponding first upper substrate pad 310 of one of the upper substrates 300 and a corresponding first upper substrate pad 310 of another of the upper substrates 300. In an embodiment, the conductive wire 350 may be mounted to be continuously connected to the upper substrates 300 and the substrate 100 and may be continuously connected to corresponding first upper substrate pads 310 of the upper substrates 300 and a corresponding first substrate pad 110 of the substrate 100.

The mold layer 150 may be disposed on the substrate 100 to cover the upper substrates 300. The mold layer 150 may cover side surfaces of the upper substrates 300 and the under fill layer 360. The mold layer 150 may be provided to seal or encapsulate the upper substrates 300, the under fill layer 360, the capacitor wires WCAP, and the conductive wire 350. The chip capacitors 500 described above may be semiconductor packages including a package substrate (e.g., substrate 100), and a plurality of chips (e.g., 300) formed on the package substrate and including capacitors formed thereon in the manner described in FIGS. 1-12 and/or 13-16, for example. Thus, the chip capacitor 500 may also be described as a package capacitor 500.

FIGS. 17 to 20 are perspective views schematically illustrating a portion of a chip capacitor according to an embodiment of the inventive concept. For the sake of brevity, the same element as in the chip capacitor described with reference to FIGS. 1 to 4 may be identified by the same reference number without repeating an overlapping description thereof.

Referring to FIGS. 17 to 20, the chip capacitor 500 may further include at least one pillar structure 140, which is disposed on the top surface 100U of the substrate 100. The pillar structure 140 may be an insulating pillar, which is formed of an insulating material, or a conductive pillar, which is formed of a conductive material. In the case where the pillar structure 140 is the conductive pillar, the pillar structure 140 may be formed of or include the same material (e.g., the same metallic material) as the first substrate pads 110 and may be electrically connected to the second substrate pads 120 of FIG. 1 through internal lines in the substrate 100.

The pillar structure 140 may have a height in the vertical direction VD, and in an embodiment, a height 140H of the pillar structure 140 may range from 30 µm to 150 µm. The pillar structure 140 may have a diameter in the horizontal direction HD, and in an embodiment, a diameter 140D of the pillar structure 140 may be about 120 µm. In the case where a plurality of the pillar structures 140 are provided on the top surface 100U of the substrate 100, a pitch (e.g., distance) between the pillar structures 140 may be about 140 µm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

At least one of the capacitor wires WCAP may be provided to wind around the pillar structure 140. The capacitor wire WCAP may have a first end portion E1 and a second end portion E2, which are opposite to each other in a longitudinal or elongation direction of the capacitor wire WCAP (e.g., in the longitudinal or elongation direction LD of the core electrode line 10 described with reference to FIGS. 2 to 4), as described with reference to FIGS. 5 to 12.

Figure 17:
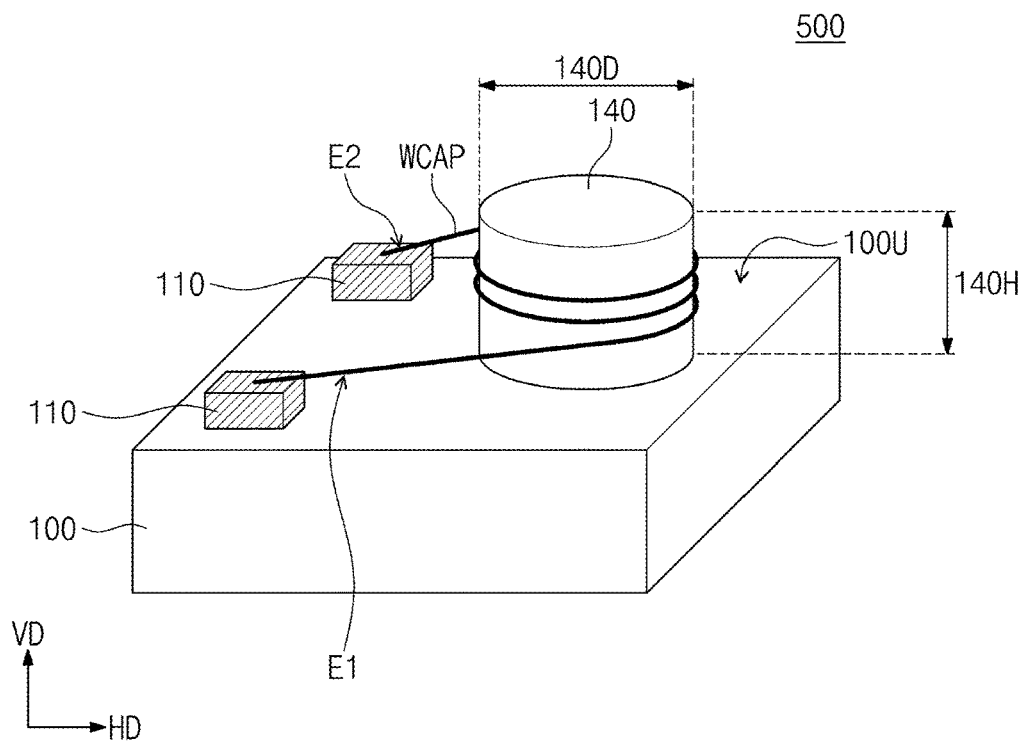
FIGS. 17 to 20 are perspective views schematically illustrating a portion of a chip capacitor according to an embodiment of the inventive concept.

As an example, referring to FIG. 17, the capacitor wire WCAP may be provided to wind the pillar structure 140, and the first end portion E1 of the capacitor wire WCAP may be connected to one of the first substrate pads 110. The second end portion E2 of the capacitor wire WCAP may be connected to another of the first substrate pads 110. This allows a longer wire to be used, which can increase capacitance of each capacitor wire.

Figure 18:
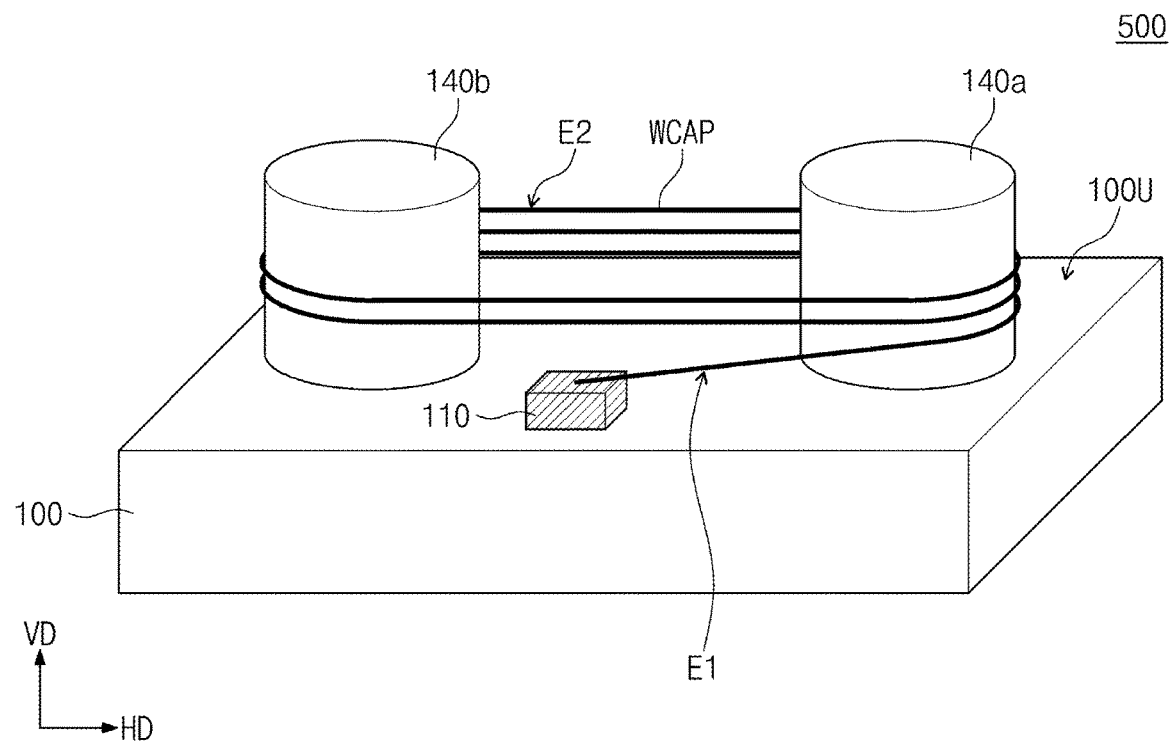

As another example, referring to FIG. 18, a plurality of the pillar structures 140 may be provided on the substrate 100, and the capacitor wire WCAP may be provided to wind around a plurality of pillar structures 140a and 140b. The first end portion E1 of the capacitor wire WCAP may be connected to one of the first substrate pads 110, and the second end portion E2 of the capacitor wire WCAP may be connected to one 140b of the pillar structures 140a and 140b. In this case, the one 140b of the pillar structures 140a and 140b may be a conductive pillar.

Figure 19:
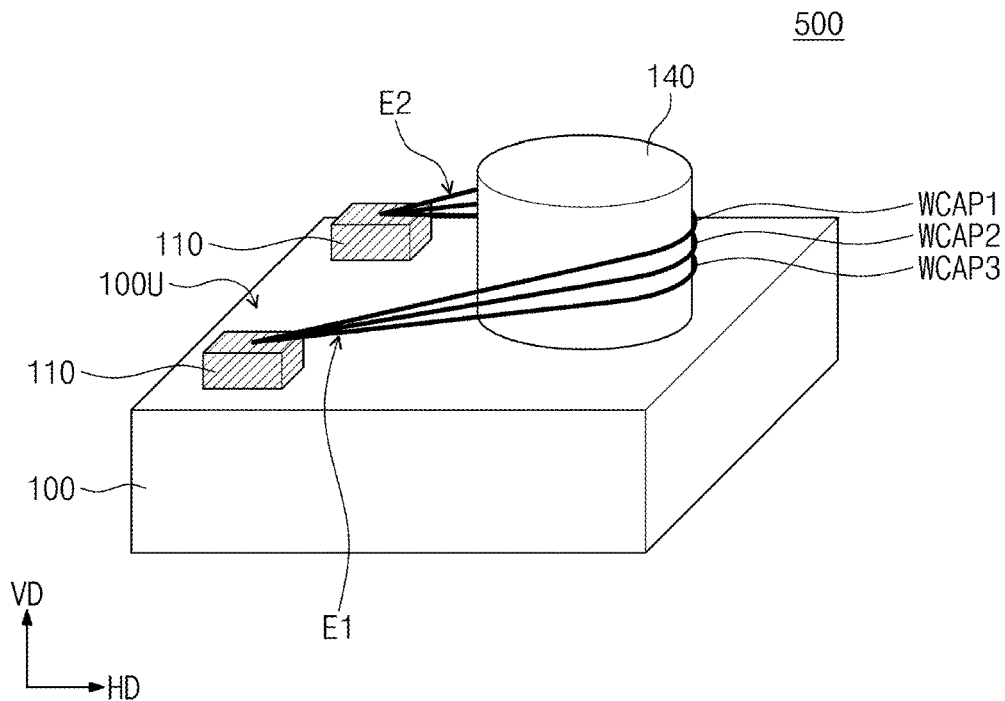

As other example, referring to FIG. 19, a plurality of capacitor wires WCAP1, WCAP2, and WCAP3 may be provided to wind around the pillar structure 140. First end portions E1 of the capacitor wires WCAP1, WCAP2, and WCAP3 may be connected in common to one of the first substrate pads 110, and second end portions E2 of the capacitor wires WCAP1, WCAP2, and WCAP3 may be connected in common to another of the first substrate pads 110. For example, in each of the first end portions E1 of the capacitor wires WCAP1, WCAP2 and WCAP3, as described with reference to FIG. 4, the end portions 10E of the core electrode lines 10 may be connected in common to one of the first substrate pads 110 by a ball bonding method or a wedge bonding method. In each of the second end portions E2 of the capacitor wires WCAP1, WCAP2 and WCAP3, the opposite end portions of the outer electrode lines 30 may be connected in common to another of the first substrate pads 110 by a wedge bonding method. The different capacitor wires here can function as capacitors connected in parallel.

Figure 20:
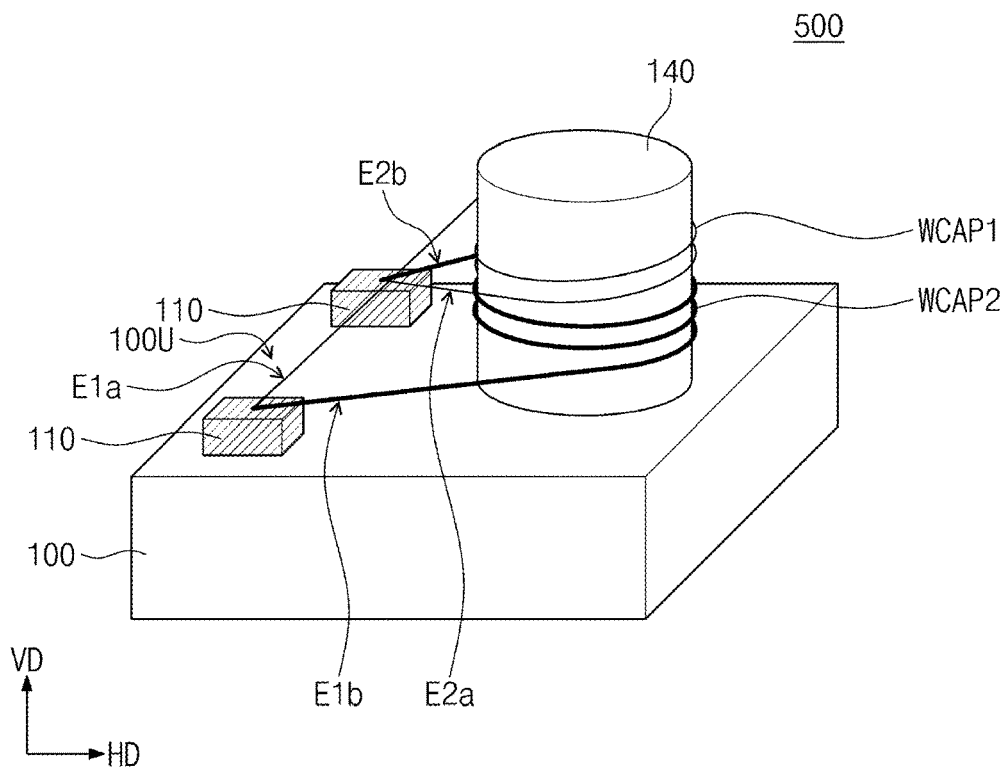

As still other example, referring to FIG. 20, a plurality of capacitor wires WCAP1 and WCAP2 may be provided to wind the pillar structure 140. A first capacitor wire WCAP1, which is one of the capacitor wires WCAP1 and WCAP2, may be provided to wind around the pillar structure 140 in a clockwise direction, and a second capacitor wire WCAP2, which is another of the capacitor wires WCAP1 and WCAP2, may be provided to wind around the pillar structure 140 in a counter-clockwise direction. A first end portion E1a of the first capacitor wire WCAP1 and a first end portion E1b of the second capacitor wire WCAP2 may be connected in common to one of the first substrate pads 110, and a second end portion E2a of the first capacitor wire WCAP1 and a second end portion E2b of the second capacitor wire WCAP2 may be connected in common to another of the first substrate pads 110.

In the present embodiment, since the capacitor wire WCAP is provided to wind around the at least one pillar structure 140, an electrostatic capacitance of the capacitor wire WCAP may be increased. In addition, in the case where the capacitor wires WCAP1 and WCAP2 are provided to wind around the pillar structure 140 in opposite directions as described with reference to FIG. 20, inductances of the capacitor wires WCAP1 and WCAP2 may be cancelled.

Figure 21:
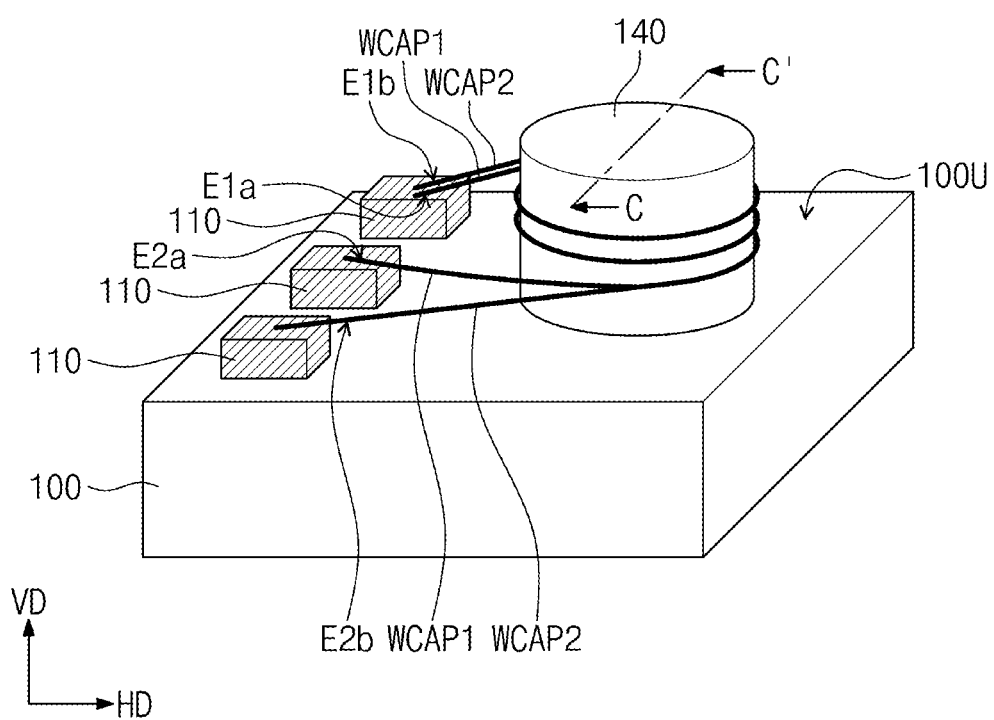
FIG. 21 is a perspective view schematically illustrating a portion of a chip capacitor according to an embodiment of the inventive concept.
Figure 22:
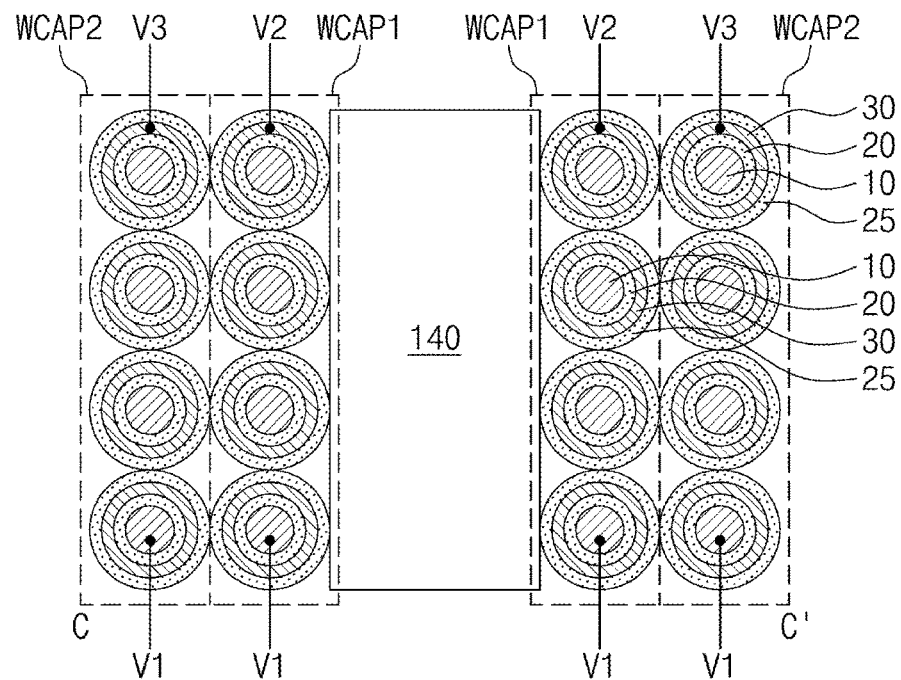
FIG. 22 is a sectional view schematically illustrating a section taken along a line C-C' of FIG. 21.

FIG. 21 is a perspective view schematically illustrating a portion of a chip capacitor according to an embodiment of the inventive concept, and FIG. 22 is a sectional view schematically illustrating a section taken along a line C-C' of FIG. 21.

Referring to FIGS. 21 and 22, the chip capacitor 500 may further include at least one pillar structure 140, which is disposed on the top surface 100U of the substrate 100, and the pillar structure 140 may be substantially the same as the pillar structure 140 described with reference to FIGS. 17 to 20.

In an embodiment, a plurality of capacitor wires WCAP1 and WCAP2 may be provided to wind around the pillar structure 140. Each of the capacitor wires WCAP1 and WCAP2 may include the core electrode line 10, the outer electrode line 30, and the dielectric line 20 therebetween, which have been described with reference to FIGS. 2 to 4, and may further include an additional dielectric line 25 enclosing the outer electrode line 30. The additional dielectric line 25 may be formed of or include substantially the same material as the dielectric line 20.

A first end portion E1a of a first capacitor wire WCAP1 of the capacitor wires WCAP1 and WCAP2 and a first end portion E1b of a second capacitor wire WCAP2 of the capacitor wires WCAP1 and WCAP2 may be connected in common to one of the first substrate pads 110. Thus, a first voltage V1 may be applied in common to the core electrode line 10 of the first capacitor wire WCAP1 and the core electrode line 10 of the second capacitor wire WCAP2.

A second end portion E2a of the first capacitor wire WCAP1 may be connected to another of the first substrate pads 110. In this case, a second voltage V2, which is different from the first voltage V1, may be applied to the outer electrode line 30 of the first capacitor wire WCAP1, and thus, electric charges may be accumulated in the dielectric line 20 of the first capacitor wire WCAP1. A second end portion E2b of the second capacitor wire WCAP2 may be connected to another of the first substrate pads 110. In this case, a third voltage V3, which is different from the first voltage V1, may be applied to the outer electrode line 30 of the second capacitor wire WCAP2, and thus, electric charges may be accumulated in the dielectric line 20 of the second capacitor wire WCAP2.

In an embodiment, the second voltage V2, which is applied to the outer electrode line 30 of the first capacitor wire WCAP1, may be different from the third voltage V3, which is applied to the outer electrode line 30 of the second capacitor wire WCAP2. In this case, electric charges may be accumulated in the additional dielectric lines 25 of the first and second capacitor wires WCAP1 and WCAP2. Thus, an electrostatic capacitance of the capacitor wires WCAP1 and WCAP2 may be increased, and it may be possible to easily increase an electrostatic capacitance of the chip capacitor 500.

Figure 23:
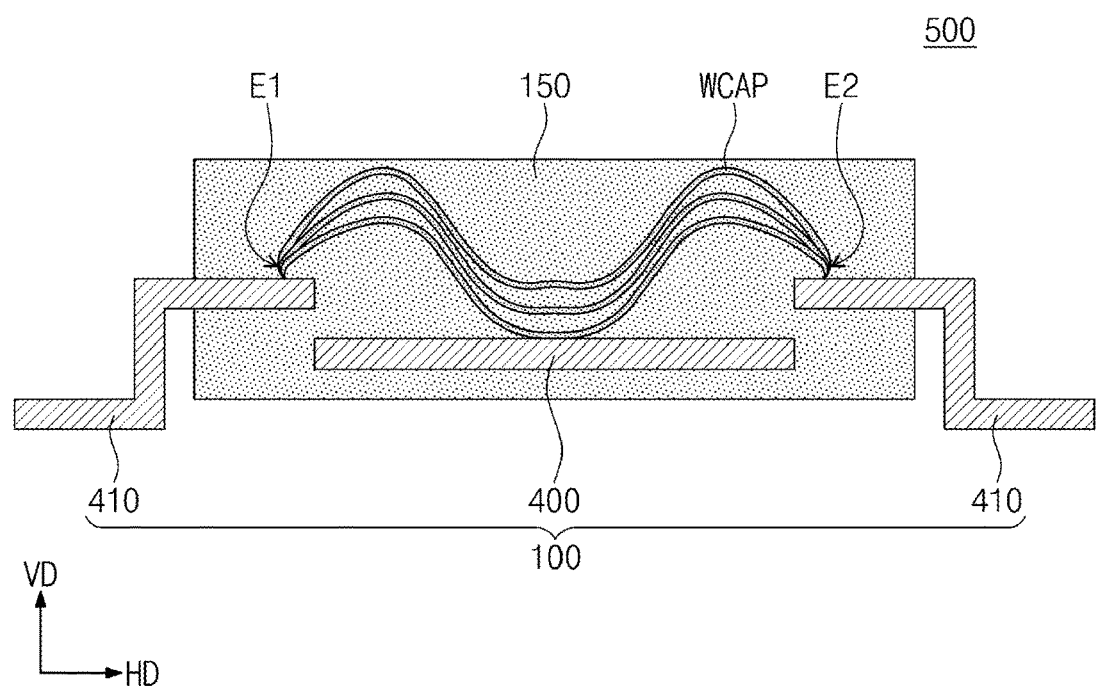
FIGS. 23 and 24 are sectional views, each of which illustrates a chip capacitor according to an embodiment of the inventive concept.

FIG. 23 is a sectional view illustrating a chip capacitor according to an embodiment of the inventive concept.

Referring to FIG. 23, a chip capacitor 500 may include a substrate 100, a plurality of capacitor wires WCAP mounted on the substrate 100, and a mold layer 150 disposed on the substrate 100 to cover the capacitor wires WCAP.

The substrate 100 may be a lead frame including a supporting substrate 400 and a plurality of leads 410. The supporting substrate 400 and the leads 410 may be formed of or include at least one of metallic materials. The supporting substrate 400 may be provided to support the capacitor wires WCAP disposed thereon, but in an embodiment, the supporting substrate 400 may be omitted.

The capacitor wires WCAP may be electrically connected to the leads 410 and may be connected to the leads 410 by a wire bonding method. The capacitor wires WCAP may be substantially the same as the capacitor wires WCAP described with reference to FIGS. 2 to 4. Each of the capacitor wires WCAP may have a first end portion E1 and a second end portion E2, which are opposite to each other in a longitudinal or elongation direction of the capacitor wire WCAP (e.g., in the longitudinal or elongation direction LD of the core electrode line 10 described with reference to FIGS. 2 to 4), as described with reference to FIGS. 5 to 12. The first end portion E1 of each of the capacitor wires WCAP may be connected to one of the leads 410. In the first end portion E1 of each of the capacitor wires WCAP, the core electrode line 10 of each of the capacitor wires WCAP may be connected to the one of the leads 410 by a ball bonding method or a wedge bonding method. The second end portion E2 of each of the capacitor wires WCAP may be connected to another of the leads 410. In the second end portion E2 of each of the capacitor wires WCAP, the outer electrode line 30 of each of the capacitor wires WCAP may be connected to the another of the leads 410 by a wedge bonding method.

The mold layer 150 may be provided to enclose the supporting substrate 400 and the capacitor wires WCAP and to cover end portions of the leads 410. The capacitor wires WCAP may be connected to the end portions of the leads 410. Opposite end portions of the leads 410 may be exposed to the outside of the mold layer 150 and may be connected to outer terminals. The mold layer 150 may be formed of or include at least one of insulating materials (e.g., epoxy molding compounds).

Figure 24:
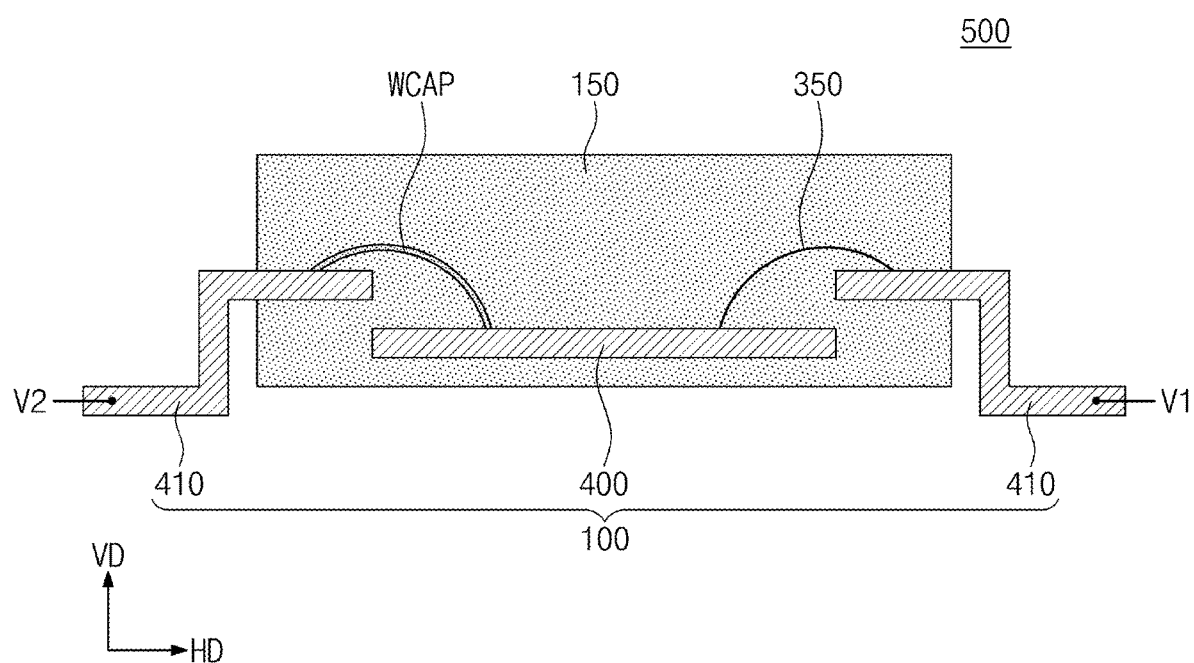

FIG. 24 is a sectional view illustrating a chip capacitor according to an embodiment of the inventive concept. For the sake of brevity, the same element as in the chip capacitor described with reference to FIG. 23 may be identified by the same reference number without repeating an overlapping description thereof.

Referring to FIG. 24, a chip capacitor 500 may include a substrate 100, at least one capacitor wire WCAP mounted on the substrate 100, and a mold layer 150 disposed on the substrate 100 to cover the capacitor wire WCAP.

The substrate 100 may be a lead frame including a supporting substrate 400 and a plurality of leads 410, and the supporting substrate 400 and the leads 410 may be formed of or include at least one of metallic materials. The chip capacitor 500 may further include a conductive wire 350, which is provided to electrically connect one of the leads 410 to the supporting substrate 400. A first voltage V1 may be applied to the supporting substrate 400 through the one of the leads 410 and the conductive wire 350.

The capacitor wire WCAP may be electrically connected to a corresponding one of the leads 410 and the supporting substrate 400 and may be connected to the corresponding lead 410 and the supporting substrate 400 by a wire bonding method. The capacitor wire WCAP may be substantially the same as the capacitor wire WCAP described with reference to FIGS. 2 to 4. The capacitor wire WCAP may have a first end portion E1 and a second end portion E2, which are opposite to each other in a longitudinal or elongation direction of the capacitor wire WCAP (e.g., in the longitudinal or elongation direction LD of the core electrode line 10 described with reference to FIGS. 2 to 4), as described with reference to FIGS. 5 to 12. The first end portion E1 of the capacitor wire WCAP may be connected to the corresponding lead 410 or the supporting substrate 400. In the first end portion E1 of the capacitor wire WCAP, the core electrode line 10 may be connected to the corresponding lead 410 or the supporting substrate 400 by a ball bonding method or a wedge bonding method. The second end portion E2 of the capacitor wire WCAP may be connected to the supporting substrate 400 or the corresponding lead 410. In the second end portion E2 of the capacitor wire WCAP, the outer electrode line 30 may be connected to the supporting substrate 400 or the corresponding lead 410 by a wedge bonding method.

The first voltage V1 may be applied to the outer or core electrode line 30 or 10 of the capacitor wire WCAP through the supporting substrate 400. A second voltage V2, which is different from the first voltage V1, may be applied to the core or outer electrode line 10 or 30 of the capacitor wire WCAP through the corresponding lead 410.

The mold layer 150 may be provided to seal or encapsulate the supporting substrate 400, the capacitor wire WCAP, and the conductive wire 350 and to cover end portions of the leads 410. Opposite end portions of the leads 410 may be exposed to the outside of the mold layer 150 and may be connected to outer terminals.

According to an embodiment of the inventive concept, a chip capacitor may be a chip-type capacitor, in which a plurality of capacitor wires are provided. Since each of the capacitor wires has a wire shape, it may be possible to easily reduce a size of each of the capacitor wires, and in this case, it may be possible to reduce a size of the chip capacitor and to increase an integration density of the capacitor wires provided in the chip capacitor. As a result, it may be easy to reduce a size of the chip capacitor and to increase an electrostatic capacitance of the chip capacitor. In addition, since each of the capacitor wires is mounted on the substrate by a wire bonding method, the capacitor wires may be easily mounted on the substrate. As a result, it may be possible to easily improve reliability of the chip capacitor.

Accordingly, it may be possible to provide the chip capacitor, which can be easily scaled down and has high performance and high reliability characteristics.

While example embodiments of the inventive concept have been particularly shown and described, it will be understood by one of ordinary skill in the art that variations in form and detail may be made therein without departing from the spirit and scope of the attached claims.

What is claimed is:

1. A chip capacitor, comprising:
a substrate;
a plurality of capacitor wires on the substrate; and
a mold layer disposed on the substrate to cover the capacitor wires,
wherein each of the capacitor wires comprises:
a core electrode line having a wire shape;
an outer electrode line covering at least a portion of the core electrode line; and
a dielectric line interposed between the core electrode line and the outer electrode line.

2. The chip capacitor of claim 1, wherein the outer electrode line comprises a material whose melting point is lower than that of the core electrode line.

3. The chip capacitor of claim 1, wherein:
the core electrode line comprises a first metal, and
the outer electrode line comprises a second metal different from the first metal.

4. The chip capacitor of claim 1, wherein each of the capacitor wires is connected to the substrate by a wire bonding method.

5. The chip capacitor of claim 1, wherein:
each of the capacitor wires has a first end portion and a second end portion, which are opposite to each other in a longitudinal direction of the core electrode line, and
at the first end portion of each of the capacitor wires, the core electrode line is connected to the substrate by a ball bonding method or a wedge bonding method.

6. The chip capacitor of claim 5, wherein, at the second end portion of each of the capacitor wires, the outer electrode line is connected to the substrate by a wedge bonding method.

7. The chip capacitor of claim 1, wherein:
the substrate has a top surface and a bottom surface, which are opposite to each other,
the substrate comprises first substrate pads, which are at the top surface, and second substrate pads, which are at the bottom surface,
the capacitor wires are disposed on the top surface of the substrate, and
each of the capacitor wires is connected to corresponding ones of the first substrate pads.

8. The chip capacitor of claim 7, wherein:
each of the capacitor wires has a first end portion and a second end portion, which are opposite to each other in a longitudinal direction of the core electrode line, and
at the first end portion of each of the capacitor wires, the core electrode line is connected to one of the corresponding first substrate pads by a ball bonding method or a wedge bonding method.

9. The chip capacitor of claim 8, wherein, at the second end portion of each of the capacitor wires, the outer electrode line is connected to another of the corresponding first substrate pads by a wedge bonding method.

10. The chip capacitor of claim 7, further comprising lower connection terminals, which are disposed on the bottom surface of the substrate and the second substrate pads, respectively.

11. The chip capacitor of claim 7, wherein the substrate is a printed circuit board, an interposer substrate, or a redistribution substrate.

12. The chip capacitor of claim 1, wherein:
the substrate is a lead frame including a plurality of leads, and
each of the capacitor wires is connected to a corresponding one of the leads.

13. The chip capacitor of claim 12, wherein each of the capacitor wires is connected to the corresponding lead by a ball bonding method or a wedge bonding method.

14. The chip capacitor of claim 1, further comprising an upper substrate, which is stacked on the substrate in a vertical direction perpendicular to a top surface of the substrate,
wherein the upper substrate has a top surface and a bottom surface, which are opposite to each other,
wherein the bottom surface of the upper substrate faces the top surface of the substrate, and
wherein the capacitor wires are mounted on at least one of the top surface of the substrate, the top surface of the upper substrate, and the bottom surface of the upper substrate.

15. The chip capacitor of claim 14, wherein:
the capacitor wires are connected to the at least one of the top surface of the substrate, the top surface of the upper substrate, and the bottom surface of the upper substrate by a wire bonding method, and
the mold layer is provided to cover the capacitor wires and the upper substrate.

16. The chip capacitor of claim 14, further comprising upper connection terminals between the substrate and the upper substrate,
wherein the upper connection terminals are provided to electrically connect the substrate to the upper substrate.

17. The chip capacitor of claim 14, further comprising:
supporting patterns between the substrate and the upper substrate; and
conductive wires electrically connecting the substrate to the upper substrate.

18. The chip capacitor of claim 14, further comprising an under fill layer between the substrate and the upper substrate,
wherein at least some of the capacitor wires are disposed in the under fill layer.

19. The chip capacitor of claim 14, wherein:
the upper substrate is one of a plurality of upper substrates, which are stacked on the substrate in the vertical direction, and
the upper substrates are stacked to have a staircase structure.

20. A chip capacitor, comprising:
a substrate having a top surface and a bottom surface, which are opposite to each other, the substrate comprising first substrate pads at the top surface and second substrate pads at the bottom surface;
a plurality of capacitor wires, which are disposed on the top surface of the substrate and are connected to the first substrate pads; and
a mold layer, which is disposed on the top surface of the substrate to cover the capacitor wires,
wherein each of the capacitor wires comprises:
a core electrode line having a wire shape;
an outer electrode line covering at least a portion of the core electrode line; and
a dielectric line interposed between the core electrode line and the outer electrode line,
wherein each of the capacitor wires has a first end portion and a second end portion, which are opposite to each other in a longitudinal direction of the core electrode line,
wherein, at the first end portion of each of the capacitor wires, the core electrode line is connected to one of the first substrate pads, and
wherein, at the second end portion of each of the capacitor wires, the outer electrode line is connected to another of the first substrate pads.

* * * * *